(12) United States Patent
Lessing et al.

(10) Patent No.: US 10,418,145 B2
(45) Date of Patent: Sep. 17, 2019

(54) STRETCHABLE CONDUCTIVE COMPOSITES FOR USE IN SOFT DEVICES

(71) Applicant: President and Fellows of Harvard College, Cambridge, MA (US)

(72) Inventors: Joshua Aaron Lessing, Cambridge, MA (US); Stephen A. Morin, Arlington, MA (US); George M. Whitesides, Newton, MA (US)

(73) Assignee: President and Fellows of Harvard College, Cambridge, MA (US)

( * ) Notice: Subject to any disclaimer, the term of this patent is extended or adjusted under 35 U.S.C. 154(b) by 292 days.

(21) Appl. No.: 14/732,302

(22) Filed: Jun. 5, 2015

(65) Prior Publication Data

US 2015/0357078 A1 Dec. 10, 2015

Related U.S. Application Data

(60) Provisional application No. 62/009,084, filed on Jun. 6, 2014.

(51) Int. Cl.
| | |
|---|---|
| *H01B 1/24* | (2006.01) |
| *G01L 1/22* | (2006.01) |

(Continued)

(52) U.S. Cl.
CPC ............... *H01B 1/24* (2013.01); *B29C 39/18* (2013.01); *G01L 1/20* (2013.01); *G01L 1/2287* (2013.01); *H01B 1/22* (2013.01); *H01F 7/02* (2013.01); *H01H 1/021* (2013.01); *H01H 36/00* (2013.01); *H01R 13/52* (2013.01); *H05K 1/0283* (2013.01); *H05K 1/0287* (2013.01);

(Continued)

(58) Field of Classification Search
CPC ... H01B 1/14; H01B 1/16; H01B 1/18; H01B 1/20; H01B 1/22; H01B 1/24; H01B 5/16; H01B 5/08; H01B 5/12; B29C 39/18; H01H 35/34; H01H 1/021; H01H 1/027; H01H 36/00; H05K 1/0283; H05K 1/0287; H05K 2201/0133; H05K 2201/0281; H05K 2201/0314; H05K 2201/0323; B29K 2305/00; B29K 2305/12; B29K 2307/04; G01L 1/20; G01L 1/2287; H01F 7/02; H01R 13/52; H01R 43/007
See application file for complete search history.

(56) References Cited

U.S. PATENT DOCUMENTS

| | | | |
|---|---|---|---|
| 3,299,393 A | * | 1/1967 | Kelley ................ H01R 9/28 439/46 |
| 3,398,233 A | | 8/1968 | Lizasoain et al. |

(Continued)

OTHER PUBLICATIONS

Purdue University, "Simple sewing machine has high-tech role in future 'soft' machines," Jun. 2, 2014, 3 pages.

(Continued)

*Primary Examiner* — Jonathan M Dunlap
(74) *Attorney, Agent, or Firm* — Wilmer Cutler Pickering Hale and Dorr LLP

(57) ABSTRACT

An elastically-deformable, conductive composite using elastomers and conductive fibers and simple fabrication procedures is provided. Conductive elastomeric composites offer low resistance to electrical current and are elastic over large (>25%) extensional strains. They can be easily interfaced/built into structures fabricated from elastomeric polymers.

19 Claims, 22 Drawing Sheets

(51) Int. Cl.
  *H01B 1/22*   (2006.01)
  *H01H 1/021*  (2006.01)
  *H01H 36/00*  (2006.01)
  *H01R 13/52*  (2006.01)
  *G01L 1/20*   (2006.01)
  *H01R 43/00*  (2006.01)
  *B29C 39/18*  (2006.01)
  *H01F 7/02*   (2006.01)
  *H05K 1/02*   (2006.01)
  *B29K 305/00* (2006.01)
  *B29K 305/12* (2006.01)
  *B29K 307/04* (2006.01)

(52) U.S. Cl.
  CPC ...... *B29K 2305/00* (2013.01); *B29K 2305/12* (2013.01); *B29K 2307/04* (2013.01); *H01R 43/007* (2013.01); *H05K 2201/0133* (2013.01); *H05K 2201/0281* (2013.01); *H05K 2201/0314* (2013.01); *H05K 2201/0323* (2013.01)

(56) References Cited

U.S. PATENT DOCUMENTS

| | | | |
|---|---|---|---|
| 3,582,449 A | 6/1971 | Stolki et al. | |
| 3,835,442 A * | 9/1974 | Anderson | H01R 31/02 174/257 |
| 3,895,162 A | 7/1975 | Lemont et al. | |
| 4,037,009 A | 7/1977 | Severinsen | |
| 4,125,309 A * | 11/1978 | Grantiz | H02B 1/207 439/48 |
| 4,133,144 A | 1/1979 | Early et al. | |
| 4,199,637 A | 4/1980 | Sado | |
| 4,209,481 A * | 6/1980 | Kashiro | B29C 70/14 264/108 |
| 4,715,235 A * | 12/1987 | Fukui | D04B 1/14 338/114 |
| 4,754,546 A | 7/1988 | Lee et al. | |
| 5,177,529 A * | 1/1993 | Schroll | G03G 15/80 310/249 |
| 5,225,643 A * | 7/1993 | Marchant | H01H 35/346 200/83 N |
| 5,379,644 A * | 1/1995 | Yanagida | G01B 7/18 73/768 |
| 5,695,859 A | 12/1997 | Burgess | |
| 6,568,945 B2 * | 5/2003 | Whybrow | H01R 13/65802 439/86 |
| 7,078,359 B2 * | 7/2006 | Stepanian | B01J 13/0091 442/172 |
| 7,504,346 B2 * | 3/2009 | Stepanian | B01J 13/0091 428/311.11 |
| 7,698,952 B2 * | 4/2010 | Renken | G01L 9/0073 73/780 |
| 7,935,415 B1 * | 5/2011 | Hansen | B29C 70/14 428/292.1 |
| 8,018,059 B2 * | 9/2011 | Swift | G03G 15/80 257/734 |
| 2003/0097878 A1 * | 5/2003 | Farringdon | A61B 5/1038 73/819 |
| 2007/0068787 A1 * | 3/2007 | Burgess | H01H 3/142 200/512 |
| 2008/0026623 A1 | 1/2008 | Emerson | |
| 2009/0031800 A1 * | 2/2009 | Maekawa | B25J 13/082 73/379.02 |
| 2011/0282164 A1 * | 11/2011 | Yang | A61B 5/01 600/301 |
| 2014/0249526 A1 * | 9/2014 | Kotov | H01B 1/22 606/41 |
| 2015/0129276 A1 * | 5/2015 | Shumaker | H01B 1/22 174/69 |
| 2015/0129808 A1 * | 5/2015 | Mrozek | H01B 1/22 252/503 |
| 2015/0204697 A1 * | 7/2015 | Taguchi | B22F 9/24 324/686 |
| 2015/0359457 A1 * | 12/2015 | Blumenthal | A61B 5/103 73/172 |
| 2016/0035525 A1 * | 2/2016 | Sime | H01H 51/01 335/179 |

OTHER PUBLICATIONS

International Search Report and Written Opinion dated Oct. 30, 2015, for the international application No. PCT/US15/34513, filed Jun. 5, 2015, 20 pages.

* cited by examiner

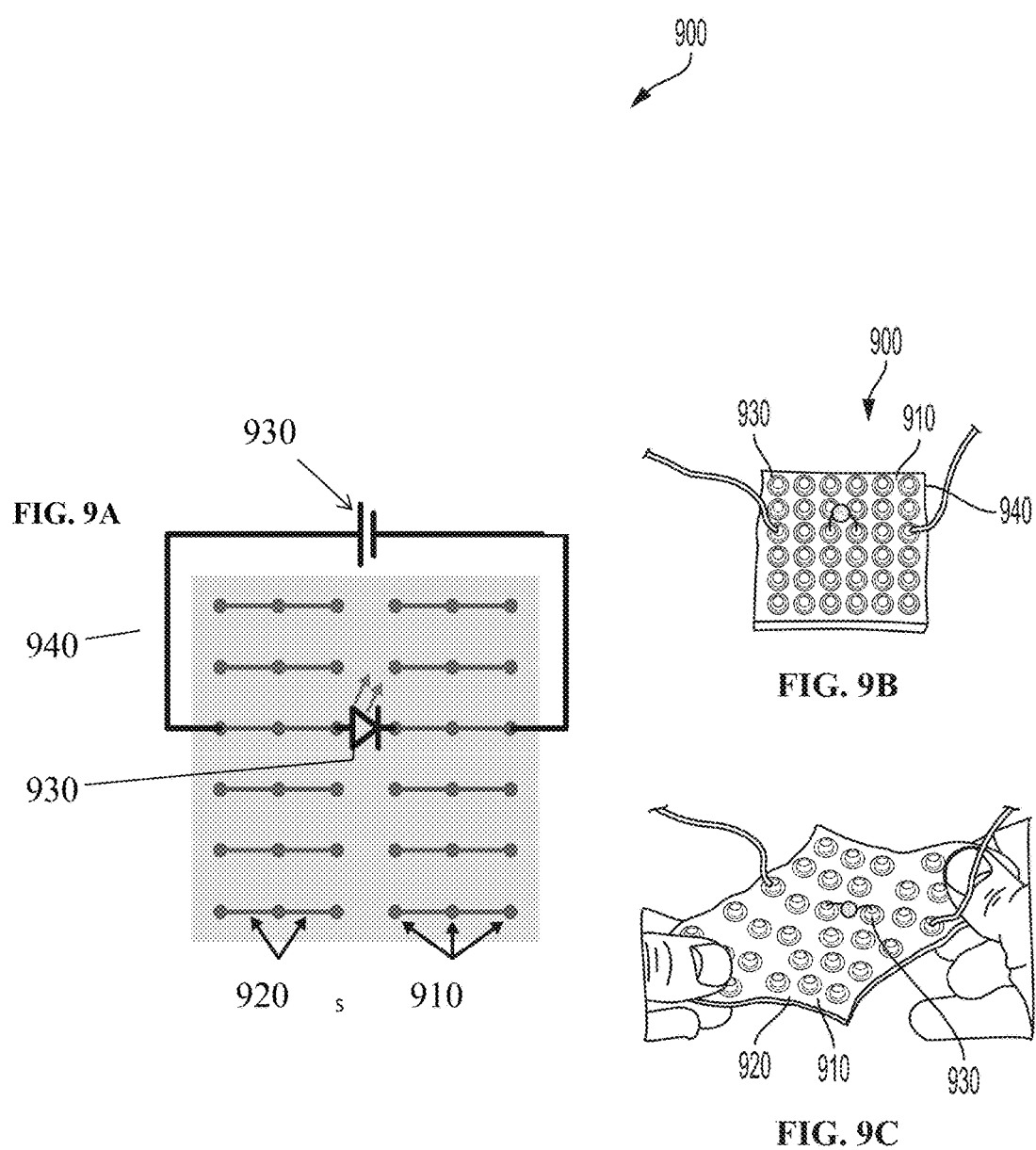

FIG 10A
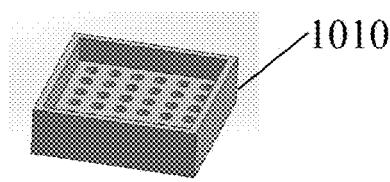
FIG. 10B
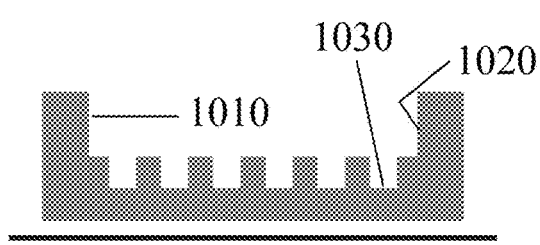
FIG. 10C
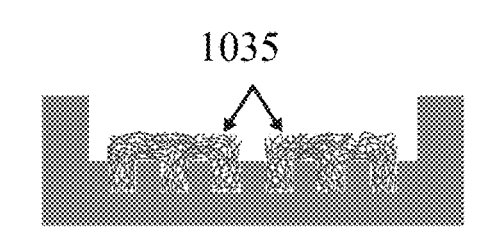
FIG. 10D
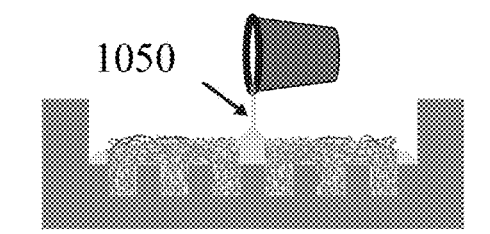
FIG. 10E Curing conditions = 60°C for >2 hrs
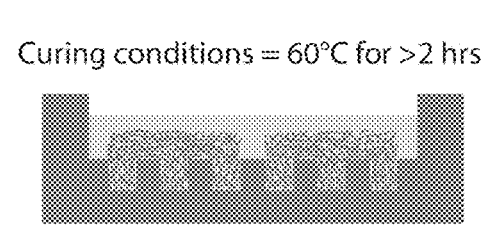
FIG. 10F Finished soft solderless breadboard
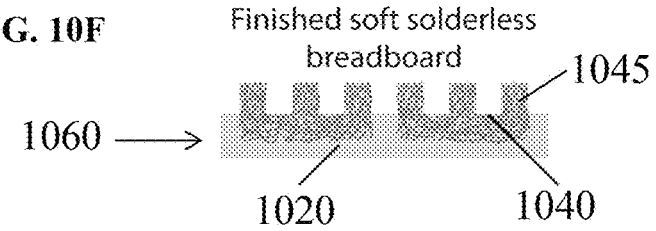

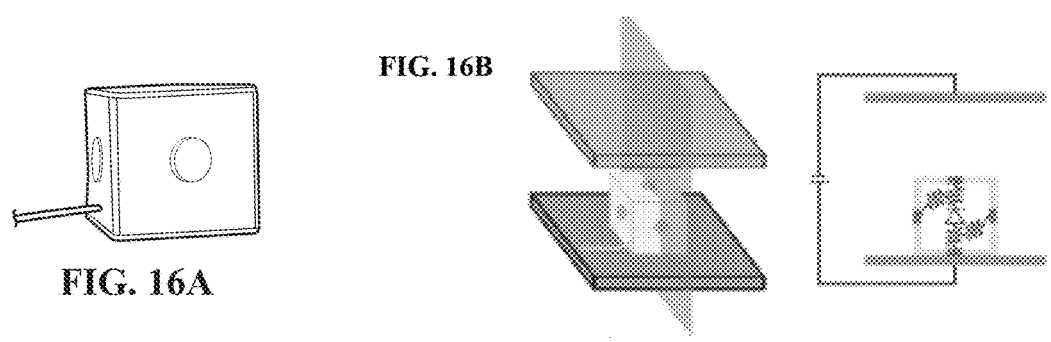
FIG. 16A
FIG. 16B
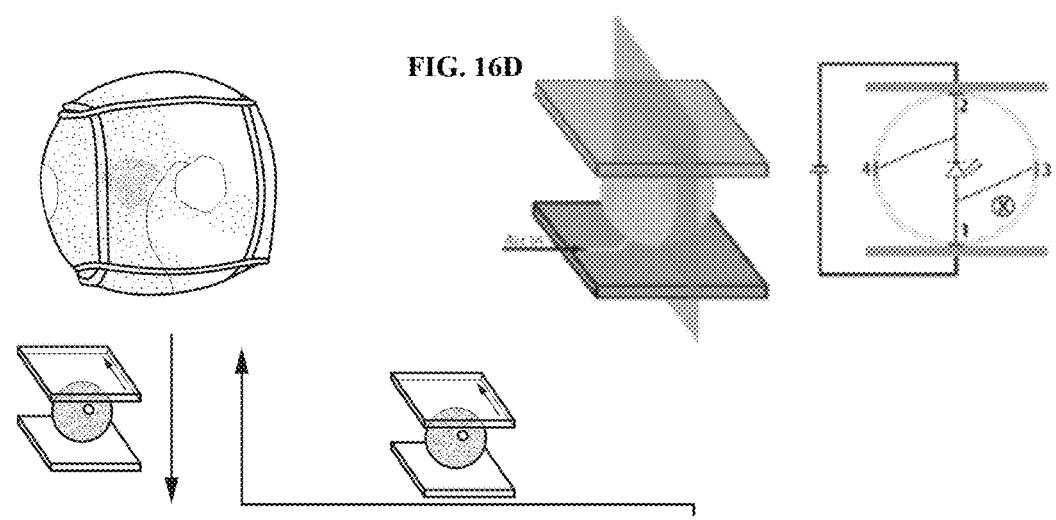
FIG. 16D
FIG. 16C
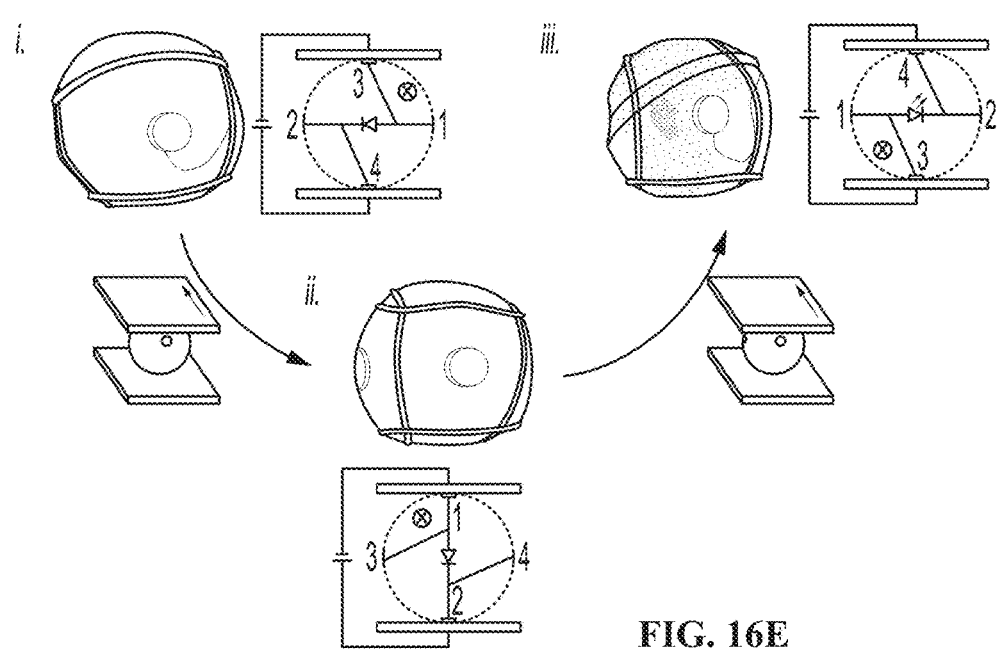
FIG. 16E

STRETCHABLE CONDUCTIVE COMPOSITES FOR USE IN SOFT DEVICES

RELATED APPLICATIONS

This application claims the benefit of priority under 35 U.S.C. § 119(e) to U.S. Ser. Application. No. 62/009,084, filed Jun. 6, 2014, the contents of which are incorporated by reference.

STATEMENT REGARDING FEDERALLY SPONSORED RESEARCH OR DEVELOPMENT

The present invention was made with United States government support under Grant No. ER45852 awarded by the Department of Energy and Grant No. DMR-0820484 awarded by the National Science Foundation. The United States government has certain rights in this invention.

INCORPORATION BY REFERENCE

All patents, patent applications and publications cited herein are hereby incorporated by reference in their entirety in order to more fully describe the state of the art as known to those skilled therein as of the date of the invention described herein.

TECHNICAL FIELD

This technology relates generally to flexible and stretchable conductive composites. In particular, this invention relates to conductive elastomeric devices. The technology also relates to soft robotics that incorporate the conductive devices.

BACKGROUND

Soft devices are machines built from soft materials (e.g. elastomers, gels, liquids). These soft devices are useful for their ability to change their size and shape readily upon electrical, chemical, pneumatic, ferrofluidic, or hydraulic actuation. In addition, the low stiffness of the materials used to construct these devices (Young's modulus <10 MPa) enables them to deform readily in response to external forces. These attributes allow soft devices to perform functions that are challenging for hard machines. Examples include interacting with delicate, soft materials (e.g. biological tissues), and performing unstructured tasks (e.g. gripping objects of undefined shape).

Integrating electronics for control systems and sensors into soft devices will be an important step in their evolution. However, metal wires, used in conventional electronics, when embedded in a soft device, often delaminate from the surrounding soft materials, or break, when the device bends and stretches—as it would during operation.

In recent years, a wide variety of soft embodiments of common electronic devices (e.g. transistors, displays, batteries, electromechanical transducers, speakers, thermal sensors, strain sensors, pressure sensors, and photo detectors) have been successfully fabricated. To meet the electrical needs of these devices, an array of stretchable electrical conduits for supplying potential and current have been created. For example, liquid metals have been used to create stretchable wires by embedding channels filled with EGaIn into elastomers to achieve highly conductive structures. Metal ion implantation can also be used to create stretchable conductive structures requiring either the use of a plasma chamber or multiple, wet-chemistry, processing steps. One mechanical approach is to create conductive, net-shaped, structures out of relatively inelastic materials using mechanical processing with controlled cutting tools to convert ridged substrates for electrical components (e.g. polyimide sheets) into stretchable nets, although they have also been fabricated via molding of PDMS. Recently, hydrogels infused with ionic conductors have been used to create transparent, biocompatible stretchable devices; but these materials do not tolerate continuous DC currents. One of the oldest and most thoroughly investigated approaches to making stretchable conductors is to create conductive particle composites that rely on a percolation network of conductive particles to conduct electricity. Though these materials are not appropriate replacements for conventional wires since their resistivity is typically large and can change by several orders of magnitude during reorganization of the percolation network induced by material strain. To date, the most successful approaches to creating small, stretchable wires has used lithographic techniques to create serpentine patterns of metal films on unstrained elastomers or on prestrained elastomers to make buckled metal films. These approaches have enabled the creation of wires capable of sustaining high strains (typically >30% with strains >300% having been reported for serpentine patterns).

SUMMARY

Conductive elastomers that rely on the bending of thin filaments of embedded conductive rigid materials to create an effective elasticity for an elastomeric composite are described. The composites are macroscopic, and designed with a focus on creating an inexpensive and easily fabricated conductive elastomeric material that will satisfy at least some of the needs in the field of soft machines. These and other aspects and embodiments of the disclosure are illustrated and described below.

It accordance with certain embodiments, an anisotropic resistivity composite material is provided which may be fabricated to control the direction of electric current flow within the composite.

In accordance with one aspect, a conductive elastomeric composite is disclosed. The composite includes a plurality of conductive fibers embedded in an elastomeric substrate providing a plurality of conductive pathways in the composite, wherein the conductive fibers have a majority fiber axis and the majority fiber axis defines a first conductive pathway in the composite. The first conductive pathway has a lower resistivity than the other conductive pathways in the composite and the composite exhibits anisotropic mechanical properties and resistivity.

In one aspect, a conductive elastomeric composite includes a plurality of conductive fibers embedded in an elastomeric substrate providing a conductive pathway in the composite;

wherein the conductive fibers have a majority fiber axis and the majority fiber axis defines a first conductive pathway in the composite, wherein the composite exhibits anisotropic mechanical and electrical properties.

In one or more embodiments, the conductive fibers comprise a bundled assembly of non-woven or non-braided or non-cabled metal fibers, or the conductive fibers comprise carbon fibers, or the conductive fibers comprise conductive polymer fibers, or the conductive fibers are selected from the group of metal filaments, carbon filaments, woven wire mats, helical wire coils, and wires bundled at the ends and fanned out in between, and for example, the conductive fibers are metal wool.

In one or more embodiments, a conductive pathway transverse to the first conductive pathway has a lower conductivity than that of the first conductive pathway.

In one or more embodiments, the conductive fibers have a length sufficient to span the conductive pathway, and/or the conductive fibers have a length in the range of 1 mm to 100 cm, and/or the conductive fibers have a diameter in the range of 0.5 µm to 500 µm.

In one or more embodiments, the elastomeric substrate is a sheet or membrane and the majority fiber axis traverses the thickness of the substrate.

In one or more embodiments, the composite is in the form of a disk and the disk is configured to provide electrical contact to an electrical component.

In one or more embodiments, the elastomeric substrate is a sheet or membrane and the majority fiber axis is in the plane of the sheet or membrane.

In any of the preceding embodiments, the ends of the metal fibers are exposed to provide electrical contact.

In one or more embodiments, the elastomeric substrate is a molded article and the majority fiber axis defines a linear or non-linear conductive pathway between two or more locations of the elastomeric substrate.

In any of the preceding embodiments, the conductive pathway has a resistivity in the range from about $10^{-8}$ to 10 Ohm·m or about $10^{-6}$ to 1 Ohm·m, or about $10^{-5}$ to $10^{-2}$ Ohm·m at 20° C.

In any of the preceding embodiments, the conductive pathway is electrically connected to an external power source.

In any of the preceding embodiments, the conductive pathway is electrically connected to an electrical component selected from lights sensors, indicators, actuators, nitinol actuators, electroactive polymer actuators, switches, capacitors, resistors, transistors, displays, force sensors, touch sensors, flow sensors, pressure sensors, range finders, shear sensors, temperature sensors, cameras, light emitting diodes, zener diodes, batteries, electro pneumatic transducers, haptic touch screens, microcontrollers, operational amplifiers, strain gauges, pneumatic, vacuum or hydraulic pumps, solenoid valves, speakers, microphones, or heating elements.

In another aspect, the conductive elastomeric composite described herein is incorporated into a soft robot to provide an electrical connection.

In another aspect, a flexible solderless breadboard includes an elastomeric base housing multiple receptacles for electrical connections, each of the receptacle comprising a raised feature comprising a conductive network of metal fibers embedded in elastomer, wherein each receptacle is in electric connection with at least one other receptacle either using metal fiber bundles embedded in the elastomeric base as elastomeric interconnects or conductive pathways.

In one or more embodiments, elastomeric receptacles are connected in series or in parallel.

In one or more embodiments, the elastomeric interconnects include metal wool bundled to have a majority fiber axis in the plane of the elastomeric base.

In one or more embodiments, the receptacles comprise metal wool having a majority fiber axis that is aligned with the axis of the receptacles.

In one or more embodiments, the elastomeric receptacles are connected in series or in parallel.

In another aspect, the conductive elastomeric composite described herein is incorporated into a strain gauge.

In one or more embodiments, a strain gauge includes conductive elastomeric composite comprising a percolation network of metal fibers embedded in an elastomeric sheet; electrical contacts in electrical contact with the percolation network of metal fibers and positioned in spaced apart relationship to define a conductive pathway there between and connectable to an external meter, such as an ohmmeter or an ammeter, for determining resistivity and/or resistance across the conductive pathway, wherein the resistivity and/or resistance varies with the strain applied to the conductive elastomeric composite.

In one or more embodiments, a strain gauge includes an ribbon of conductive liquid, oil or grease whose resistivity varies as a function of expansion or compression (degree of strain); and a pair of connectors in electrical contact with the expandable conductive liquid, oil or grease and connectable to an external meter, said connectors in spaced apart positions on opposing sides of the ribbon of conductive liquid, oil or grease, wherein the connector comprises a percolation network of metal fibers, wherein the connector pair and the ribbon of conductive liquid, oil or grease are embedded in an elastomeric body to form a leak resistant electrical connection.

In one or more embodiments, the conductive liquid, oil or grease comprises a conductive carbon grease.

In one or more embodiments, percolation network of metal fibers comprises a majority fiber axis and the majority fiber axis defines a first conductive pathway to connect the expandable conductive liquid, oil or grease to an external meter.

In another aspect, a switch is provided including the conductive elastomeric composite as described herein.

In one or more embodiments, a switch includes a first elastomeric sheet comprising a first electrical contact, the first electrical contact comprising a plurality conductive fibers embedded in an elastomeric substrate, wherein the conductive fibers have a majority fiber axis and the majority fiber axis defines a first conductive pathway in the composite that traverses the thickness of the sheet; a second elastomeric sheet comprising a second electrical contact, the second electrical contact comprising a plurality conductive fibers embedded in an elastomeric substrate, wherein the conductive fibers have a majority fiber axis and the majority fiber axis defines a first conductive pathway in the composite that traverses the thickness of the sheet; wherein the first and second sheets are capable of moving from a first position in which the first and second electrical contacts are in electrical contact with one another to a second position in which the first and second electrical contacts are spaced apart from one another.

In one or more embodiments, the first and second elastomeric sheets are sealed to form an inflatable chamber and the chamber is pressurizable to move the first and second electrical contacts into and out of first and second positions.

In one or more embodiments, the first electrical contact comprises a magnetic metal and the second electrical contact comprises a non-magnetic metal and further comprising a magnet for moving the first and second electrical contacts into and out of first and second positions In another aspect, a leak resistant electrical connection is described that includes a channel having a liquid, oil or grease; an electrical connector in contact with the liquid, oil or grease channel, wherein the connector comprises a percolation network of metal fibers; wherein the connector pair and the liquid, oil or grease channel are embedded in an elastomeric body to form a leak resistant electrical connection.

In another aspect, a method of making a conductive elastomeric composite includes providing a bundled assembly of metal fibers into a mold, the bundled assembly of metal fibers arranged to have a majority fiber axis; a protective end cap positioned over the ends of the metal fibers; providing a mold having a depression disposed therein, positioning the metal fiber assembly with a protective end cap in the mold depression; filling the mold with a curable elastomer to a volume that permits the second end of the metal fiber assembly to extend beyond the filled volume; and curing the elastomer.

In another aspect, a method of making a conductive elastomeric composite includes providing a sheet comprising a metal fiber assembly, the bundled assembly of metal fibers have a majority fiber axis; rolling the sheet along its minor fiber axis to obtain a rolled cylinder whose majority axis is aligned with the cylinder axis; introducing the rolled cylinder into a mold; filling the mold with a curable elastomer; curing the elastomer and removing the cured composite from the mold; sectioning the cured composite into thin sections, each section have a plurality of metal fibers traversing the thickness of the section.

In one or more embodiments, the method further includes embedding the section an elastomeric sheet to provide an elastomeric sheet comprising a region of metal fibers traversing the thickness of the section.

The elastomeric composites may be used in the construction of various devices such as a soft robot, a strain gauge, a switch, etc.

These and other aspects and embodiments of the disclosure are illustrated and described below.

BRIEF DESCRIPTION OF THE DRAWINGS

The invention is described with reference to the following figures, which are presented for the purpose of illustration only and are not intended to be limiting.

In the Drawings:

FIGS. 3A-3B illustrate the anisotropic conductivity of a conductive elastomeric composite according to one or more embodiments, which show the thermal signature (° C.) generated by resistive heating when a current of 5 A passes through a conductive elastomeric composite sheet for 10 seconds which was used to illustrate the path taken by the electrical current while traversing the sheet, in which FIG. 3A shows current passing parallel to the majority fiber axis and FIG. 3B shows current passing perpendicular to the majority fiber axis (optical image (Left) and thermal image (Right)); in the optical photographs an arrow indicates the direction of the majority fiber axis. The temperature scales shown in the thermal images are provided in degrees Celsius.

FIGS. 9A-9C illustrate conductive elastomeric composites used to interface soft and hard electrical components according to one or more embodiments, in which (A) is a circuit diagram of a set of forward biased wires illuminating a LED via electrical connections made entirely by the conductive elastomeric composites fiber bundles and receptacles of a soft solderless breadboard; (B) is an illustration of a soft solderless breadboard with a LED and wires inserted into its receptacles to create a closed circuit as evidenced by the illumination of the LED; and (C) is an illustration of the soft solderless breadboard maintaining its electrical connections during elongation as evidenced by the illumination of the LED.

FIGS. 10A-10F provide a schematic illustration of the fabrication of the soft solderless breadboard according to one or more embodiments.

FIGS. 16A-16F illustrates an inflatable soft structure fabricated from elastomeric sheets with conductive elastomeric composite patches bridged by an internal LED, in which (A) an illustration of the uninflated cube between two oppositely charged metal plates. The dark portions at the center of each tile are conductive. In the interior of the cube is an LED whose anode was connected to three faces of the cube and whose cathode was connected to the remaining three faces (all connections were made to the conductive patches). (B) Schematic showing the experimental setup (left) and the circuit diagram (right) corresponding to the cross-section indicated in the schematic. (C, D) Illustrations of an inflated cube that was illuminated as a result of the anode (face 1) and cathode (face 2) of the LED making contact with the charged plates in the forward bias direction. (E) Illustration and schematic sequence showing the inflated cube as it was rolled between the plates from the forward bias configuration, C, to the reverse bias configurations, i and ii, to a second forward bias configuration, iii, and back to the original forward bias configuration in C. (F) Illustration and schematic sequence showing an inflated cube being rotated 360° between the plates while maintaining electrical contact.

DETAILED DESCRIPTION

Figure 1A:
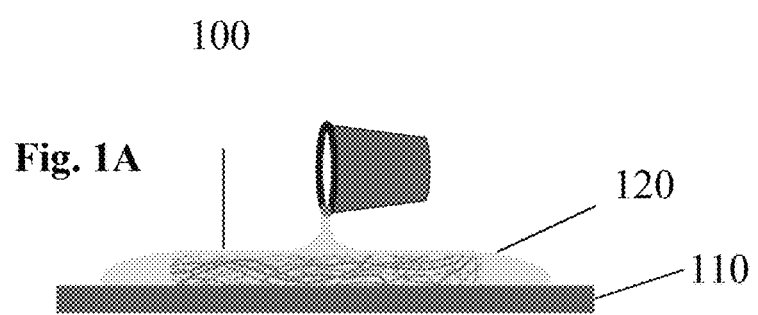
FIGS. 1A-1C are schematic representations of the fabrication of a conductive elastomeric sheet showing (A) pouring, (B) pressing) and (C) fiber orientation according to one or more embodiments.

In one aspect, flexible elastomeric conductive elements are provided including a conductive network of macroscopic scale metal fibers embedded in an elastomeric substrate. The conductive elements can be electrically connected to external circuits to provide power to run or operate various electrical components, such as lights, sensors, indicators, actuators, switches, strain gauges, pneumatic, vacuum, and hydraulic pumps, solenoid valves, speakers, microphones, heating elements, nitinol actuators, and the like. The composite according to one or more embodiments combines the large elastic range of elastomeric polymers with the electrical conductivity of conductive fiber, typically metal fiber, such as metal wool or fine metal wire, to realize a stretchable, conductive, material. Non-metallic conductive fibers such as carbon fibers or conductive polymer fibers can also be used.

Many elastomers are available with a range of mechanical and optical properties, etc. that are suitable for use as the elastomeric material. The invention is described with reference to a silicone elastomer, but other elastomers (e.g., polyurethanes and natural rubbers) would also be suitable.

The conductive fiber can be made of any suitable conductive material, typically conductive metal, such as iron, aluminum, copper, bronze, steel, stainless steel, Nitinol, gold. In certain cases, slightly resistive wire would be useful as well for heating (e.g., Nichrome). The fibers can also possess other properties, such as magnetism or ferromagnetism, that can be useful in device function. In one or more embodiments, the metal fibers form a bundled metal fiber assembly made of entangled metal fibers that allows the fibers to move and bend within the bundle rather than fracture. This allows the metal network to remain intact while the elastomeric material is bent, compacted or stretched.

In one or more embodiments, the metal fibers are macroscale, that is they have a length of at least 1 mm, and preferably greater than 5 mm, or greater than 1 cm or greater than 10 cm. The fiber diameter is in the range of 0.5 µm to 500 µm, more particularly from 1 µm to 150 µm and more typically in the range of 5 µm to 50 µm. The flexibility of the metal wool is a function, at least in apart, of fiber thickness.

The cross section of the wires can take on any geometry, e.g., round, circular, triangular, quadrilateral, rectangular, square and the like. In some embodiments, the wire cross section is circular as the absence of corners helps reduce the cutting of the wires through the soft elastomer during use. The wires can be provided in various shapes, such as wire braid, spiral coil, zig zag design, sinusoidal slot, wire mesh, sinusoidal wire coil, helical coil, fishbone, flexible coil, connected zig-zag wires, etc. More than one type of shape may be present in the composite.

The metal fibers can be bundled or arranged so that the fibers are oriented predominantly in one direction, e.g., there is a "majority fiber axis". In a three dimensional object, the majority axis would be the one in which more than one-third, e.g., more than 33.333%, of the fibers are generally oriented in the same direction, e.g., ±45° or less, or ±25° or less relative to the axis, and would typically correspond to the path of lowest resistivity (highest conductivity). In certain embodiments, the majority axis includes greater than 33.333%, or greater than 50% and up to 100% of the fibers are generally oriented in the same direction. In general, there is no preference for the degree of orientation. The selected fiber orientation depends on the particular application. If the fibers are 100% pointing in a single direction then the material will be very conductive and stiff in that direction and nonconductive and elastomeric perpendicular to the fiber axis. Alternatively, the composite could contain an isotropic distribution of fibers which would make the material equally conductive and elastomeric in all directions. The steel wool composites set forth in some of the examples herein are conductive in the direction parallel and perpendicular to the fiber axis. The composites are more conductive parallel to the fiber axis. In situations where more conductivity is desired in the direction of elongation, current is passed the parallel to the majority fiber axis is oriented parallel to the direction of elongation and in situations in which more elasticity is desired in the direction of elongation, the current is passed majority fiber axis is oriented perpendicular to the direction of elongation majority fiber axis (at the cost of being more resistive).

In one or more embodiments, the metal fibers are fine metal wires that are assembled bundles. The assembled fiber bundles can be a non-woven or non-braided or non-cabled assembly of fibers. The metal fiber lengths are on a macro scale and can be distinguished from conductive particle, flake or short fiber assemblies that rely on a percolation network where charge moves between intersecting particles or quantum tunneling between particles to create conductive pathways (at least in the majority axis direction of the composite described here). Such composites have higher resistivity and can be sensitive to strain. In conductive elastomeric composites having higher conductivity, at least some of the metal fibers are of a length sufficient to span at least one conductive pathway. In such instances, the fibers can provide a direct conductive path and demonstrate resistivities closer to the component metals. In other embodiments, the conductive path for an electron is made up on average of 100 intersecting conductive fibers per centimeter or less. In other embodiments, the conductive path for an electron is made up on average of 10 intersecting conductive fibers per centimeter or less. Due to the intersecting arrangement of wires, it is not necessary to have individual wires spanning the entire conductive pathway in order to observe high conductivity. The ability to withstand strain without breakage arises from the fine diameter of the wires and the orientation of the wires perpendicular to the stretching direction to minimize stress. In accordance with certain embodiments, the composites disclosed herein provide conductive pathways having resistivities in the range from about $10^{-8}$ to 10 Ohm·m, more particularly about $10^{-6}$ to 1 Ohm·m, and in certain cases, about $10^{-5}$ to $10^{-2}$ Ohm·m at 20° C.

The metal fibers can be, for example, wire wools, conductive meshes, braided cables, speaker wire, bundles of fibers in a serpentine pattern, woven wire mats, helical wire coils/springs, and wires that are bundled at their ends but fanned out towards the middle of the bundle and any repeating pattern there in. Such configurations for the conductive fibers allow the composite to stretch and compress without breaking electrical conduction or the fibers themselves.

In one or more embodiments, the metal fiber is metal wool, also referred to as wire wool or wire sponge. Metal wool is a mat of metal filaments machined from a metal rod. It is a bundle of strands of metal filaments, typically very fine soft metal filaments. In the case of commercially available steel wool or bronze wool and the like, the metal fibers are provided in the form of a mat or pad in which the metal fibers are already oriented in predominantly one direction. Metal wool is available in a variety of metals (e.g. steel, copper, aluminum, brass), and is available commercially as rolls or pads. The most common metal wool is steel wool.

Steel wool is available with a range of fiber thickness, as reported in the table below, which are suitable for use in the conductive elastomeric composites according to one or more embodiments. A metal wool with an average fiber width ~25 μm resulted in conductive composites capable of large deformation (>25%).

TABLE 1

| Steel Wool fiber thickness | | | |
|---|---|---|---|
| Grade Name | Grade Code | inches | mm |
| Super Fine | 0000# | 0.001 | 0.025 |
| Extra Fine | 000# | 0.0015 | 0.035 |
| Very Fine | 00# | 0.0018 | 0.040 |
| Fine | 0# | 0.002 | 0.050 |
| Medium | 1# | 0.0025 | 0.060 |
| Medium Coarse | 2# | 0.003 | 0.075 |
| Coarse | 3# | 0.0035 | 0.090 |
| Extra Coarse | 4# | 0.004 | 0.100 |

Metal fiber assemblies are suitable for constructing conductive elastomeric composites because they have electrical and mechanical properties that are functionally useful for a stretchable conductive material: (i) as a metal, it can provide an electrically conductive path across the fiber network, (ii) as a bundled material, the metal fibers produces an entangled mat of spring-like fibers that bend when strained rather than fracturing, and/or (iii) the metal fiber compositions can be selected to maximize the reversibility of the composite upon elongation, e.g., steel, due to its higher yield strength relative to other materials (e.g. copper, bronze, brass, aluminum, etc.).

The stretchability of the conductive fiber bundles is achieved through bending of individual thin rigid filaments. When a bundle of metal wool fibers is stretched perpendicular to the majority fiber axis, the fibers bend away from each other. The bending stiffness of a metal wool fiber, assuming it is in the shape of a rod, is given by (Equation 1):

$$EI = E\frac{\pi d^4}{64} \quad (1)$$

where EI is the bending stiffness, E is the elastic modulus, I is the area moment of inertia, and d is the diameter of the fiber. The bending stiffness of fine metal fibers scales nonlinearly with the diameter of the metal fiber, making fibers in a fine metal wool dramatically more bendable than those in a coarse metal wool. A metal wool with an average fiber width ~25 μm as the conductor resulted in a conductive composite capable of deformation. Thus conductive composites according to one or more embodiments enable embedment embedding of conductive wires in an elastomer body that do not delaminate when the elastomeric body is stretched.

The fibers of the metal wool are long and can substantially traverse the conductive path of the circuit to form a conductive pathway through the elastomer. In one or more embodiments, the metal fibers are assembled to provide a majority fiber axis, wherein a more than one third or a majority, but not necessarily all, of the fibers are pointing in one direction. In other embodiments, anisotropically oriented metal fiber assemblies can be commercially obtained, e.g., as steel wool or other commercially available wires. The fibers can be oriented in a selected direction. For example, the fibers can be arranged to orient in the plane of the elastomeric sheet, e.g., for conduction within the elastomer sheet. In other embodiments, the fibers can be oriented perpendicular to the plane of the elastomeric sheet, e.g., for conduction transverse to the elastomer sheet. Orienting metal fibers in the direction of desired current flow minimizes the sheet resistance during application.

Figure 1B:
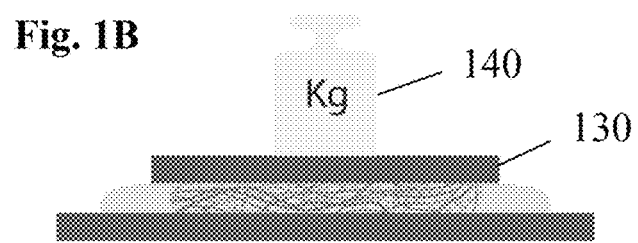
Figure 1C:
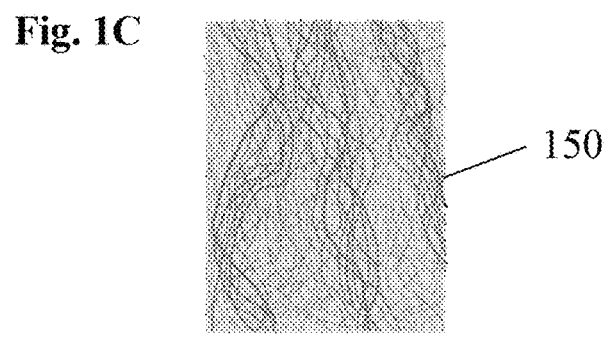
Figure 2A:
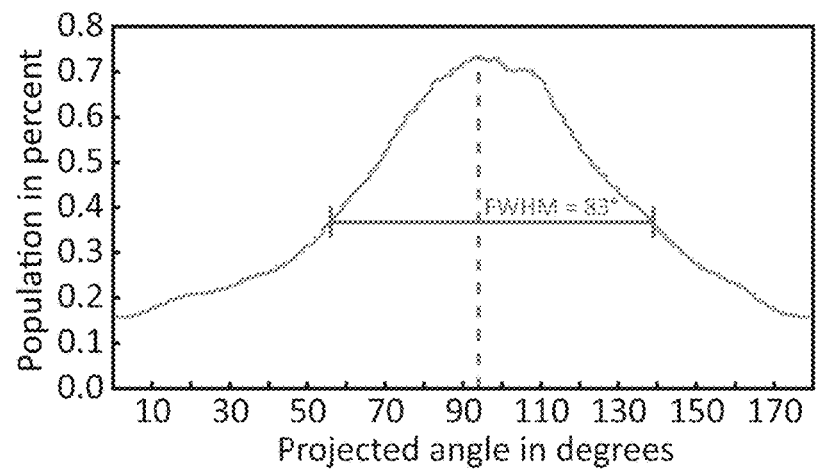
FIG. 2A is a graph showing the population distribution for the orientation of steel fibers in a steel wool elastomer composite relative to the majority fiber axis (denoted here as 94°) and FIG. 2B is the stress vs. strain plot for representative steel wool composite sheets pulled parallel and perpendicular to the majority fiber axis. Stress and strain data are provided based on measurements of engineering stress and engineering strain.

An exemplary method for the formation of a conductive elastomeric composite in which the majority fiber axis is parallel to the plane of the elastomer sheet is illustrated in FIG. 1. A sheet of metal fibers 100, e.g., steel wool, is placed on a plate 110 and soaked in uncured elastomer 120, as shown in FIG. 1A. The elastomer-soaked metal wool sheet is then cured, e.g., heat-cured in an oven, while being pressed by a top metal plate 130. Pressure is shown in FIG. 1B as additional weights 140 applied to the sheet; however, any conventional method can be used. The pressure helps to give uniform sheet thickness. It also helps to orient fibers so that they are in the plane of the sheet since fibers that are bowing away from the plane of the sheet would be straightened by the weighted plate. The cured product can then be trimmed to generate the final composite sheet 150, as shown in FIG. 1C. In some embodiments, the fiber alignment is due to the alignment in the original metal wool sheet. In other embodiments, the fibers can be aligned prior to adding the elastomer resin. By way of example, magnets could be used to align the fibers, one could also insert the fibers into grooves in a solid plate or other form and then cast into the form. One could also get approximately 100% straight fibers and layer them in different directions to make a sheet with a specific distribution of fiber directions. FIG. 2A shows the population distribution of steel fibers in a conductive elastomer composite sheet and illustrates the orientation of the steel fibers along an axis. The figure illustrates that the greatest number of fibers are aligned at approximately 94° (designated as the majority fiber axis), with an angle deviation of HWHM of 42°. Fiber orientation is a factor in defining the elasticity and conductivity in the different directions of the composite. In other embodiments, injection molding, compression molding, and thermoforming can be used to form the conductive composites.

Surface modifications (both chemical and mechanical) can be made to the fibers to improve adhesion of the elastomer to the fibers. For example, vinyl functional groups could be appended to the surface of the fibers so they can covalently bond to platinum cured silicones during the curing process.

Figure 5:
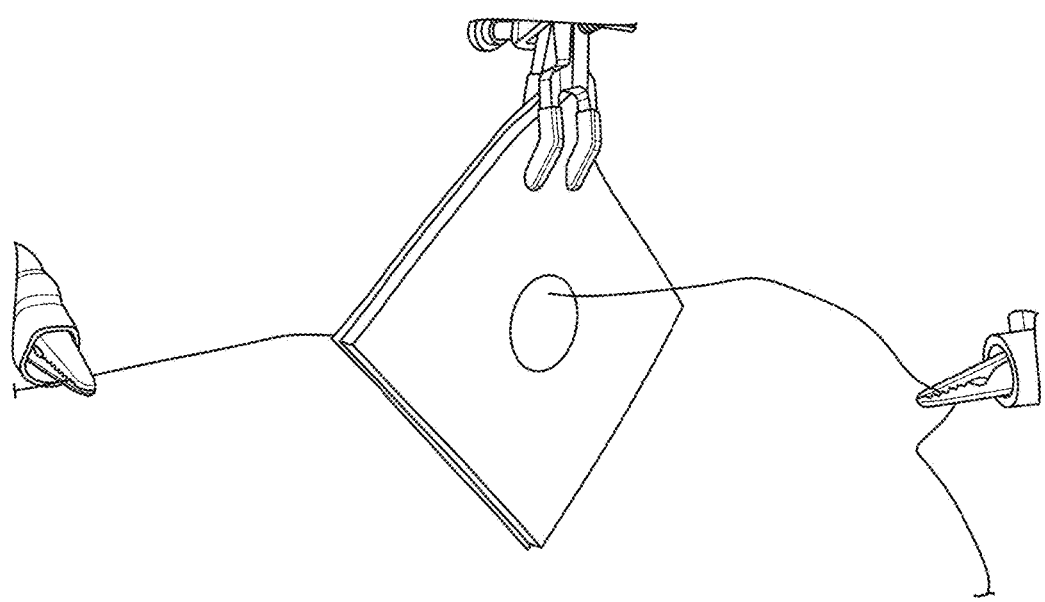
FIG. 5 is an illustration of an elastomeric sheet with a disc shaped steel wool conductive elastomeric composite via at its center according to one or more embodiments.
Figure 6A:
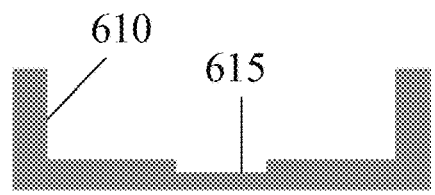
FIGS. 6A-6E are schematic illustrations of the fabrication of the elastomeric sheet with a steel wool via according to one or more embodiments.
Figure 6B:
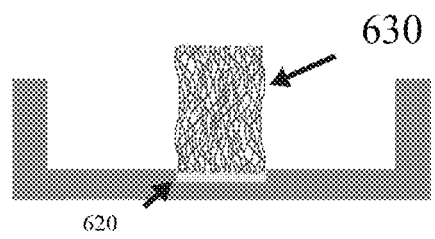
Figure 6C:
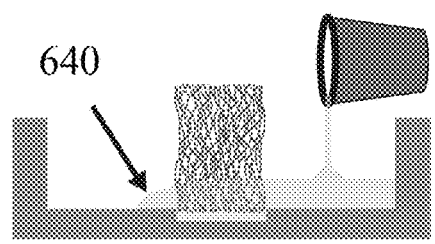
Figure 6D:
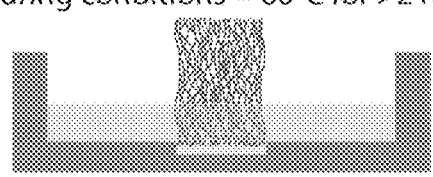
Figure 6E:
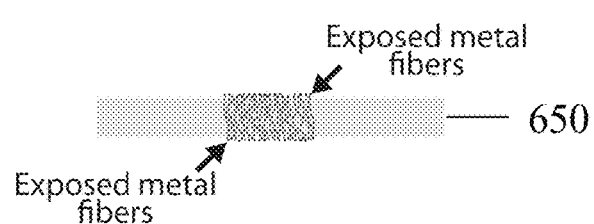

In one or more embodiments, the conductive composite serves as a via, capable of conducting transversely across the sheet. FIG. 5 shows a sheet made from a silicone elastomer with a conductive elastomeric composite disk at its center; this disk creates an electrical pathway across the sheet with a resistance of 1.0Ω. An exemplary method for the formation of a conductive elastomeric composite in which the majority fiber axis is perpendicular to the plane of the elastomer sheet is illustrated in FIG. 6A-6E. A mold 610 for constructing the device includes a recess 615 as shown in FIG. 6A. Next, a protective end cap 620, e.g., sulfur-free clay is placed in a recess at the base of the mold and metal wool 630 is positioned on top, as shown in FIG. 6B. The end cap is used both to affix the metal wool prior to the addition of uncured elastomer and to mask the metal fibers at the base of the wool so that they remain uncoated by elastomer thereby minimizing the resistance of the final device. Uncured elastomer 640 is added to the mold (FIG. 6C), followed by curing (FIG. 6D). The cured material can be demolded and the excess steel wool trimmed away with a scissor to create the finished device 650, as shown in FIG. 6E. The fibers run perpendicularly to the elastomer sheet and contain exposed fibers on either side for electrical contact.

In other embodiments, the metal fibers can be located in the desired position and aligned using magnetic attraction of the fiber to a magnet. For example, the metal fibers can be magnetic and a magnet can be positioned below the region where it is desired to locate the fibers. The fibers will migrate and remained positioned in the region due to the magnetic attraction of the fibers to the magnetic field. The magnet pins the steel wool in place during the casting and curing of elastomer. See, Example 5 and FIG. 13, for further details.

Figure 2B:
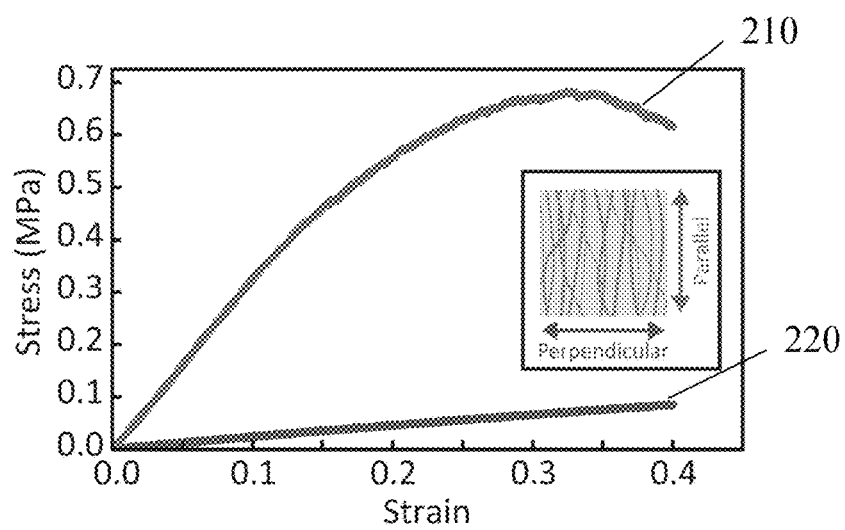

The anisotropy of alignment of metal fibers along a fiber axis results in anisotropy in the mechanical properties of the conductive elastomeric composite, as is illustrated in FIG. 2B. FIG. 2B shows the stress vs. strain plot for a conductive elastomeric composite measured parallel (210) and perpendicular (220) to the majority fiber axis. Stress and strain data are provided based on measurements of engineering stress and engineering strain. Test results show that the composite is relatively more rigid along the majority fiber axis, but comparatively extensible perpendicular to the axis.

Figure 3A:
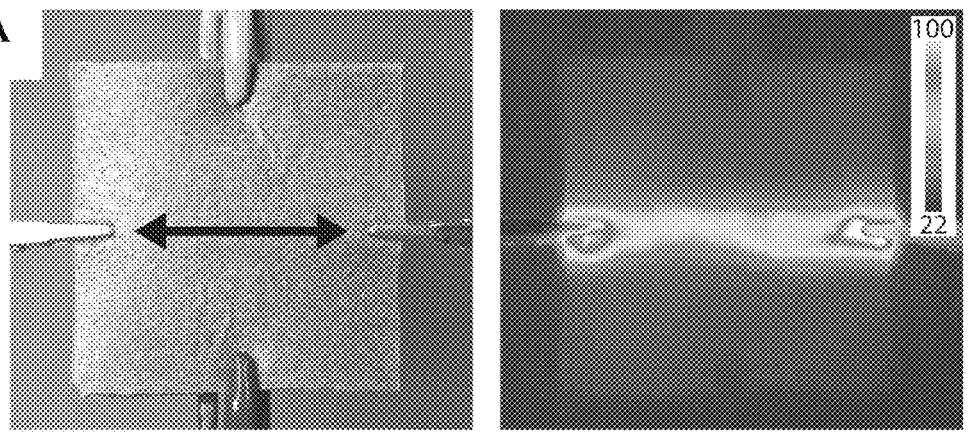
Figure 3B:
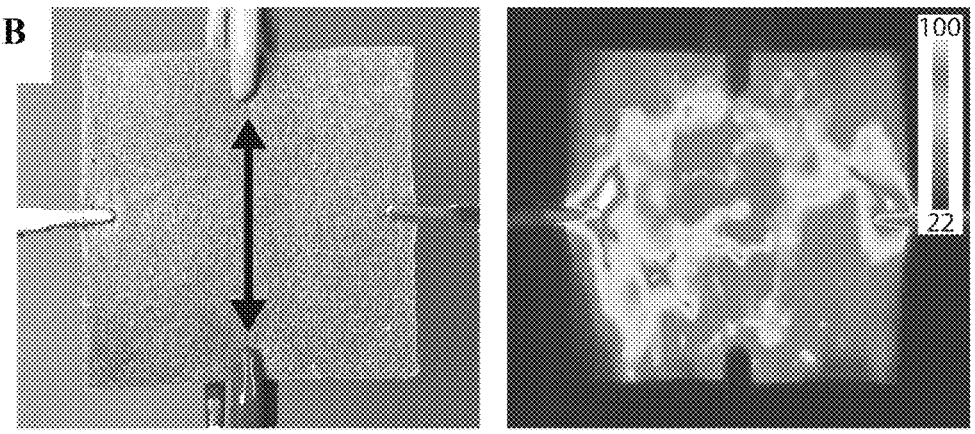

The anisotropy of alignment of metal fibers along a fiber axis also results in anisotropy in the conductive properties of the conductive elastomeric composite, as is illustrated in FIGS. 3A and 3B. A 5 A current was passed through a conductive elastomer for 10 seconds as shown in the optical images (left) and thermal images (right) in FIG. 3A and FIG. 3B. The arrow in the optical images indicates the direction of the majority fiber axis in each photograph. The thermal signature (right) of the sheets were generated by resistive heating which illustrates the path taken by the electrical current while traversing the sheets. The current path is very different in the two scenarios, and shows that current flows in a narrow path when conducting along the majority fiber axis and flows in a more tortuous route when transmitting perpendicular to the majority fiber axis. Such differences in current transmission can be exploited when designing conducting elements for different purposes. For example, where it is desired for the composite to be stretchable in the plane of the elastomer sheet and conductive perpendicular to the plane, the majority fiber axis can be made to be pointing perpendicular to the plane of the elastomer sheet.

Figure 4A:
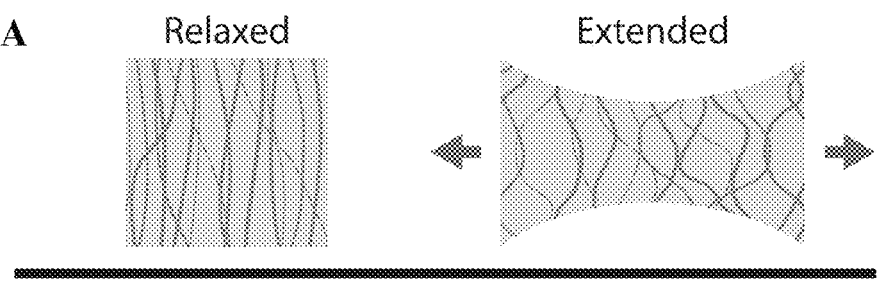
FIG. 4A is an illustration of a conductive elastomeric composite sheet in a relaxed and extended state and FIG. 4B is a plot of resistivity vs. strain for a representative conductive elastomeric composite sheet, made from steel wool and a silicone elastomer, that was elongated by 33% in the direction perpendicular to the majority fiber axis as current was passed in the same direction as the elongation.
Figure 4B:
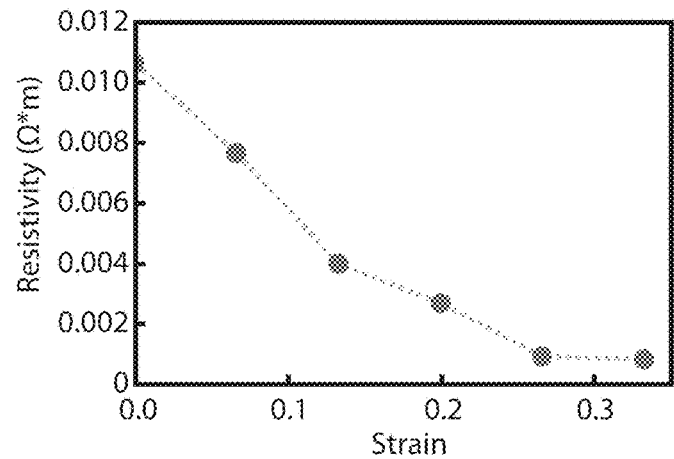

The resistivity of a conductive elastomeric composite sheet can be altered by stretching. The reduction in resistance of a conductive elastomeric composite sheet, as it is stretched perpendicular to the majority fiber axis, is a function of elongation; this decrease reflects the rearrangement of the percolation network upon stretching the material. Previously, it was observed that a percolation network is not required according to one or more embodiments. In particular, when passing current parallel to the majority fiber axis, a percolating network is not required for high conductivity. Where, as in the current embodiment, current is passed perpendicular to the majority fiber axis, a percolating network can be used. The change in resistivity as a function of strain can be used as a strain gauge. FIG. 4A illustrates how the system level stretchability of a conductive elastomeric composite sheet is achieved through a combination of elastically deforming the polymer and bending of the thin rigid filaments of the metal fiber. FIG. 4B shows a plot of resistivity vs. strain for a conductive elastomeric composite sheet that was elongated in the direction perpendicular to the majority fiber axis, as current flowed in the same direction as the elongation. The plot shows a reduction in resistivity from $1.06 \times 10^{-2}$ in its relaxed state to $0.08 \times 10^{-2}$ Ω*m at a strain of 0.33. A similar trend is also observed for conductive elastomeric composite sheets made from aluminum and bronze wool. Although the resistance of a conductive elastomeric composite sheet, in its relaxed or extended state, is higher than the resistance of a metallic sheet of similar dimensions, it is sufficiently low that a conductive elastomeric composite can act as an electrical connection in many circuits.

The characteristics (e.g., chemistry, flexibility, extensibility, conductivity, etc.) of the composite can be used to achieve function that would be difficult to achieve with other materials: i) the composite can be fabricated and subsequently integrated with other elastomeric polymer components; ii) the composite can function as an electrical conduit through an insulating elastomeric sheet without significantly perturbing the yield stress of the sheet; and iii) the composite can be stretched, compressed, bent and folded to make conformal, electrical contact with non-planar surfaces. These properties can be used to prepare conductive circuits, electrical contacts, conductive switches, strain gauges and other components that are flexible and stretchable. Because of their flexible and stretchable characteristics, they can be readily incorporated into soft robots and soft machines.

In one embodiment, the conductive elastomeric composite is used to create conductive regions in an elastomeric body. The conductive elastomeric composite can be shaped as disks, that are formed integrally in the elastomeric sheet (as described in Example 2) or that can be separately manufactured and subsequently embedded into an elastomeric sheet (as shown in Example 3). In some embodiments, the majority fiber axis of the disks can be oriented perpendicular to the surface of the elastomeric sheet in order to minimize electrical resistance across the sheet, and to minimize the stiffness of the conductive elastomeric composite in the plane of the sheet. The ability to create conformal electrical connections around non-linear bodies can be used to electrify soft robotics. For example, this could be used as part of a charging station for a soft autonomous robot. In this case, the soft robot could extend its fingers to make electrical contact with the electrical termini of a charging station containing charged metal plates or spheres with the goal of charging the robots battery. Alternatively, these pads could be used to sense if a soft gripper grabbed something conductive.

Figure 7A:
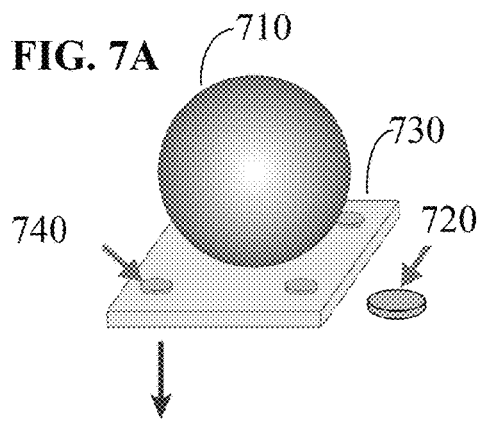
FIGS. 7A-7F illustrate the use of a conductive elastomeric composite to create conductive regions in an elastomeric body that can electrically connect over non-planar surfaces according to one or more embodiments, in which the conductive elastomeric composite containing sheet is simultaneously used as a battery receptacle and as an electrical connection to a metal ball.
Figure 7B:
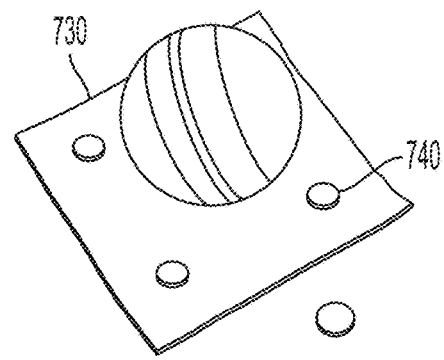
Figure 7C:
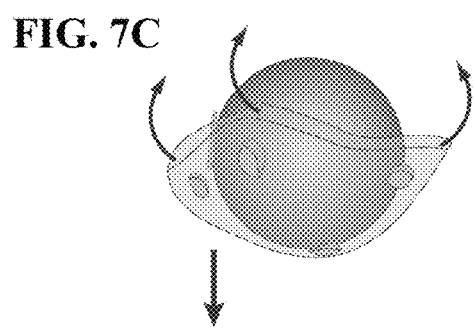
Figure 7D:
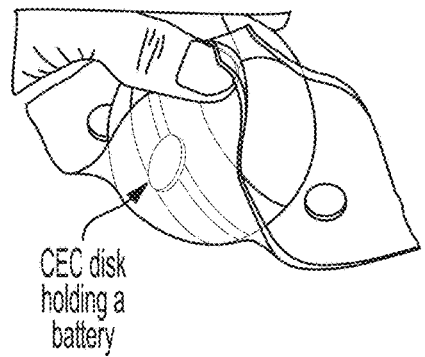
Figure 7E:
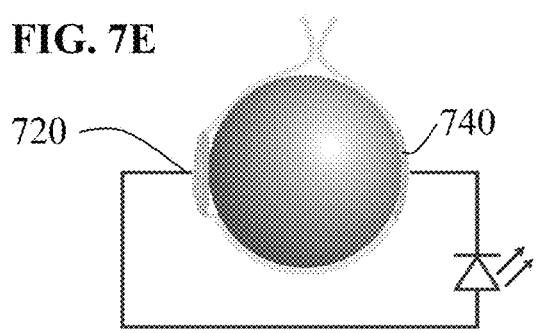
Figure 7F:
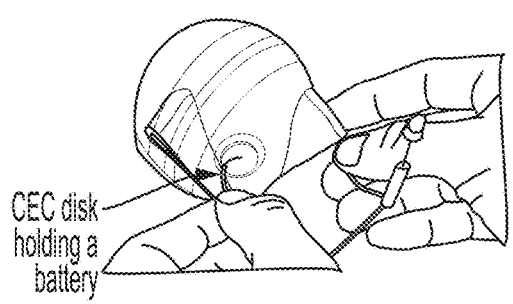

As an example, four conductive elastomeric composite disks can be embedded in an elastomeric sheet that is subsequently stretched around a metallic sphere. The illustrations in FIGS. 7A and 7B depict a metal sphere 710, button battery 720, and an elastomeric sheet 730 with four embedded composite disks 740. Stretching the sheet around the metallic sphere can make conformal contact between the composite and a steel ball. The stress associated with stretching the sheet around the sphere "holds" the conductive elastomeric composite disks in conformal, electrical contact with the surface of the sphere and could be used to position other objects around the sphere—in this case a button battery, as shown in illustrations in FIGS. 7C and 7D. These conductive elastomeric composite disks create electrical pathways across the elastomeric sheet that make conductive contact with the sphere at the positions of the disks. Here the battery is pinned between one of the disks and the ball, as shown in FIG. 7F. FIG. 7E illustrates the circuit diagram of an LED which is illuminated by bridging two of the composite disks embedded in the sheet. Positioning the battery between a conductive elastomeric composite disk and the sphere generates a difference in potential between the composite and the sphere, which is demonstrated by illuminating a light-emitting diode. This embodiment shows that conductive elastomeric composites can be used to create regions in an elastomer that are capable of distributing current and potential.

In other embodiments, conductive elastomeric composites can be used to create electrical receptacles for making electrical connections with hard metal components. This capability is useful for connecting conventional hard electrical components (e.g. wires, LEDs, transistors, capacitors, resistors, etc.) to electrical components embedded in soft machines.

In one or more embodiments, the elastomeric interconnect comprises one or more conductive elastomeric receptacles configured to electrically contact an external electrical component. Hard electrical components can be contacted with or inserted into the conductive elastomeric receptacles. The elastic and forgiving nature of the composite helps to maintain electrical connections to hard electrical components—even upon deformation and stretching of the soft machine. The one or more conductive elastomeric receptacles can be in electrical communication to other electrical components in the soft machine through conductive elastomeric pathways. Both the receptacles and the conductive pathways are made using bundles of metal fibers in an elastomeric base.

In one or more embodiments, the conductive elastomeric composite can be used to provide flexible elastomeric solderless connections for electrical components, e.g., an 'elastomeric breadboard'. The elastomeric breadboard can include multiple receptacles for electrical connections, each of the receptacles comprising a conductive network of metal fibers. In one or more embodiments, the metal fibers are metal wool having a majority fiber axis that is aligned with the axis of the receptacles. The elastomeric receptacles are connected, e.g., in series or in parallel or using a more complex circuitry, to each other using metal fiber bundles as elastomeric interconnects or conductive pathways that serve as circuit lines. In one or more embodiments, the elastomeric interconnects include metal wool bundled to have a majority fiber axis in the plane of the flexible breadboard. In other embodiments, the interconnects can be an assembly of fine metal wires.

The solderless breadboards described herein can have a layout of a typical solderless breadboard. A typical solderless breadboard includes two types of areas, called strips. Strips consist of interconnected electrical terminals.

An elastomeric solderless breadboard is shown in FIGS. 9A-9. FIG. 9A is a schematic illustration of an elastomeric solderless breadboard 900 including steel wool receptacles 910 and steel wool fiber bundle interconnects 920. The soft breadboard, made entirely of a silicone elastomer and steel wool, is connected to an LED 930 through a set of biased copper wires 940 via the conductive elastomeric composite connection in the elastomeric breadboard. FIG. 9B is an illustration of a soft solderless breadboard with a LED and wires inserted into its receptacles to create a closed circuit as evidenced by the illumination of the LED. The illumination of this LED established that electrical contact between soft and hard components was maintained when the soft breadboard was stretched and flexed, as evidenced in the illustration in FIG. 9C.

In other aspects, the conductive elastomeric composite can be used in the manufacture of switches that can be incorporated into flexible and stretchable devices, such as soft robotics, to turn circuits ON or OFF. The composite could also be used as a force or pressure sensor where a load could be placed on the soft switch which closes the circuit and inflate until there is enough pressure to open the circuit by separating the conductive pads with the applied internal pressure. The switches can be driven in a variety of ways, for example, pneumatically, hydraulically, magnetically and the like. The switch could be closed by leaving a weight on the switch or due to collision with a target. Application of vacuum could also be used to toggle the switch.

Conductive elastomeric composites can be used to provide electrical connections across a pressurized interface. In one or more embodiments, conductive contacts, e.g., conductive elastomeric composite disks embedded in an elastomeric surface or membrane, are actuated by pressure to reversibly move between spaced apart and contacting positions. In the contacting position, an electrical circuit is closed, enabling a desired operation. The two surfaces housing the disks can be maintained in a resting position that spaces the disks in a variety of ways. In one embodiment, the membranes are in contact when at rest but separated by air pressure.

Figure 11A:
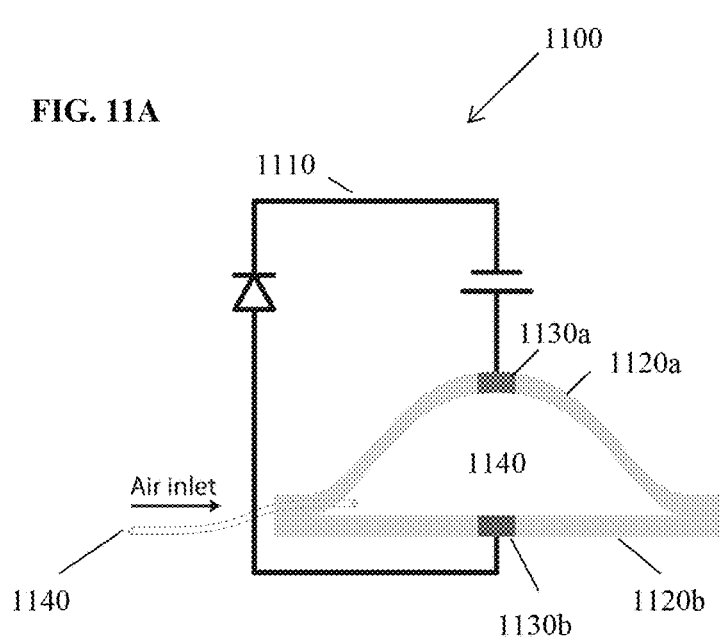
FIGS. 11A-11C illustrate the use of conductive elastomeric composite pads to make electrical connections across pressurized interfaces, in which (A) is an illustration of a soft switch consisting of a pair of elastomeric films, with embedded conductive elastomeric composite pads, separated by a volume of pressurized air (~14 kPa) connected to a simple LED circuit, and (B) is an illustration of the open circuit with fully separated conductive elastomeric composite pads; and (C) is an illustration of the system with the top membrane depressed, closing the circuit and illuminating the LED.
Figure 11B:
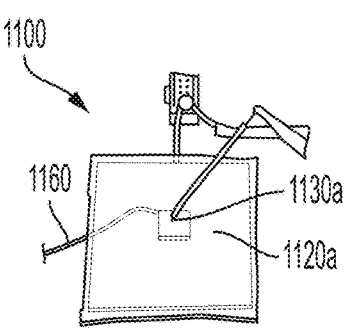
Figure 11C:
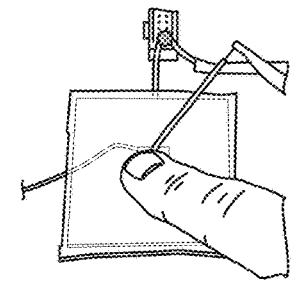

FIGS. 11A-11C illustrate a soft switch that closes a circuit when depressed according to one or more embodiments. The soft switch was constructed by forming an air tight seal between two elastomeric sheets with conductive elastomeric composite pads at their center. The conductive pads are in electrical contact with an electrical component that receives current when the two pads make electrical contact. FIG. 11A is an illustration of a soft switch 1100 connected to a simple LED circuit 1110. Here the switch consists of a pair of elastomeric films 1120a, 1120b, with embedded conductive elastomeric composite pads, 1130a, 1130b, separated by a volume of pressurized air (~14 kPa) 1140. The shape of these conductive elastomeric composites were patterned via the attraction of ferromagnetic steel wool to a rectangular prism shaped magnet, producing square conductive elastomeric composite pads, as discussed in Example 5. After fabrication, the interior of the switch is pressurized (~14 kPa) by a compressed air line 1160 seen to the left of each photo. FIG. 11B is an illustration of the open circuit with fully separated conductive elastomeric composite pads. In the absence of an external force, the membranes films remain in an extended state that separates the conductive elastomeric composite pads. When the membrane top film is compressed the pads come into contact, close the circuit, and illuminate the LED, as illustrated in FIG. 11C.

Figure 12A:
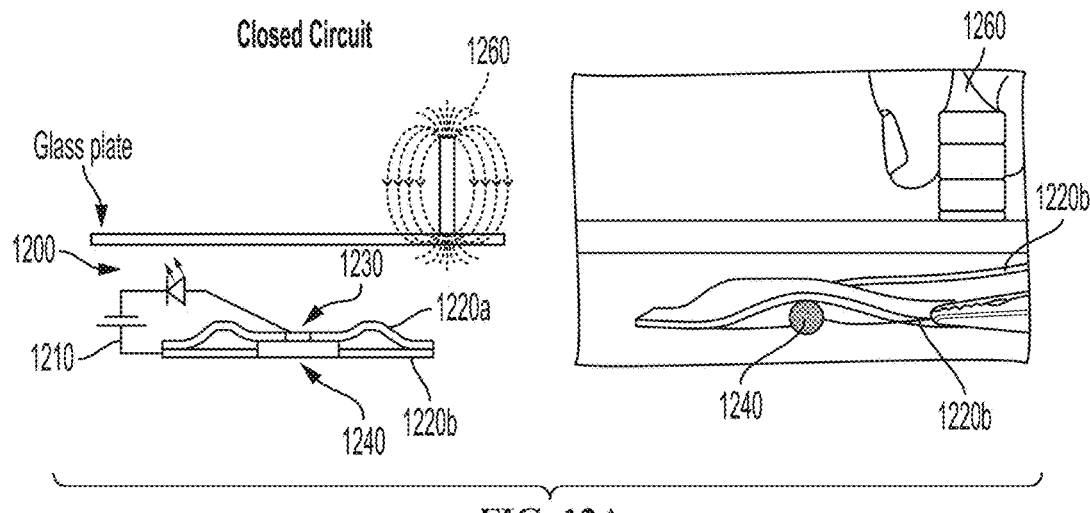
FIGS. 12A and 12B illustrate the use of conductive elastomeric composite pads to make electrical connections operably by magnetic force, in which (A) is an illustration of a soft magnetic switch consisting of a pair of elastomeric films, with embedded magnetic and non-magnetic conductive elastomeric composite pads with the top composite pad in a resting state in contact with the lower composite pad, closing the circuit and illuminating the LED, and (B) is an illustration of the open circuit with fully separated conductive elastomeric composite pads, in which a magnet is used to separate the upper magnetic pad from the lower non-magnetic pad.
Figure 12B:
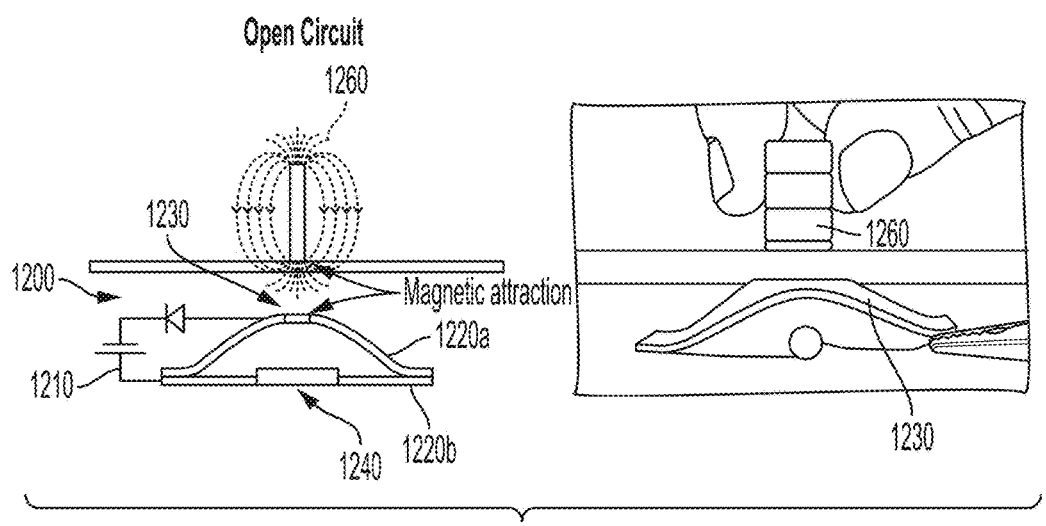

Conductive elastomeric composites can be used to make or break electrical connections using magnetic forces. In one or more embodiments, the magnetic switch can include two opposing elastomeric sheets with conductive elastomeric composite pads at their center. The conductive pads are in electrical contact with an electrical component that receives current when the two pads make an electrical connection. At least one of the conductive pads is magnetic, so that it can be actuated by the application of a magnetic field. FIG. 12A is an illustration of a soft magnetic switch 1200 connected to a simple LED circuit 1210. Here the switch consists of a pair of elastomeric films 1220a, 1220b, with embedded conductive elastomeric composite pads, 1230 and 1240. In this particular embodiment, pad 1230 is magnetic and contains steel wool, while pad 1240 is non-magnetic and contains brass fibers. In the absence of a magnetic field, pad 1230 rests on pad 1240 and an electrical connection is made, illuminating the LED. FIG. 12A provides a schematic diagram of the device in this ON state. To open the circuit and disconnect the light, a magnet 1260 is brought into proximity to the embedded conductive elastomeric composite pads, 1230 and 1240. The magnet raises magnetic pad 1230 into a second activated position spaced apart from non-magnetic pad 1240, which is not affected by the proximity of the magnet. FIG. 12B provides a schematic diagram of the device in this OFF state.

In other embodiments, the conductive elastomeric composites can be used to create leak resistant electrical connections to channels containing embedded liquids, oils or greases (a problem often encountered when affixing hard caps to the ends of liquid-filled elastomeric tubes). The ability to create durable electrical connections with liquids, oils and greases embedded in an elastomer can be used to create strain gauges that rely on changes in resistance or capacitance upon application of strain to the soft sensor.

Figure 14A:
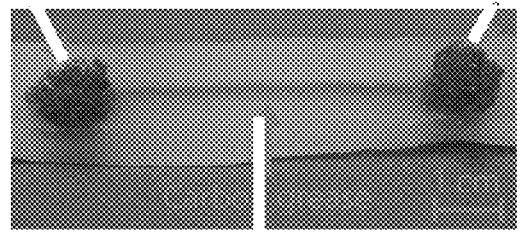
FIGS. 14A-14C illustrates the use of conductive elastomeric composites to make soft strain gauges in which an elastomer embedded carbon grease filament is contacted at both ends by conductive elastomeric composites fiber bundles according to one or more embodiments.
Figure 14B:
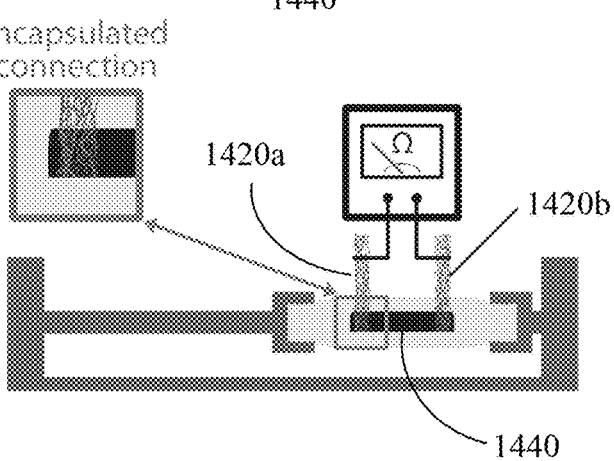
Figure 14C:
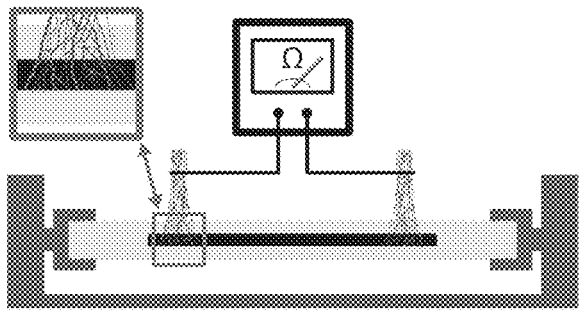

FIG. 14A shows a photograph of a soft strain gauge 1400 prepared according to one or more embodiments, consisting of an elastomer embedded carbon grease filament 1410 contacted at both ends by conductive elastomeric composite fiber bundles 1420a, 1420b. FIG. 14B is a schematic illustration of a soft strain gauge connected to an ohm meter in its low resistance state prior to elongation. The insert in FIG. 14B shows the interface between the conductive elastomeric composite fiber bundles 1420 and the conductive grease strip, in which the metal fibers are closely aligned. FIG. 14C is a schematic illustration of the soft strain gauge in its high resistance state after thinning and elongation of the carbon grease filament. The insert in FIG. 14C shows the interface between the conductive elastomeric composite fiber bundles 1420 and the conductive grease strip in the elongated state, in which the metal fibers are stretched apart. The enlarged images on the left side of B and C show an elastomer encapsulated conductive elastomeric composite electrical connection in its relaxed and elongated states, respectively. Because the bundled wires are flexible and form a redundant electrical connection due overlapping and percolative fiber arrangements, the fiber bundle can maintain electrical contact on expansion. The increase in resistance of this system allows the gauge to be used as a sensor; the change in resistance—measured by an ohm meter connected to the conductive elastomeric composite's at either end of the device—arises from the thinning and elongation of the bead of grease during strain. For this device, a fine bead of carbon grease was deposited, through extrusion printing, onto a thin, elastomeric sheet and brought these beads into contact with bundles of steel wool, which were then encapsulated in more elastomer. See Example 6 and FIG. 15. By connecting the steel wool to the grease bead by encapsulation in polymer, a seamless electrical connection that resists leaking is possible. In the case of the strain gauge shown here device resistance is measured, but resistivity under extension and compression can also or alternatively be measured.

Figure 20:
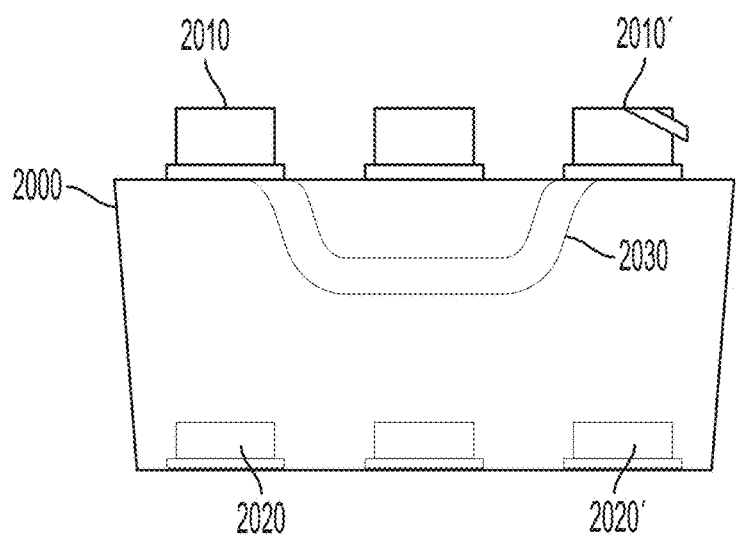
FIG. 20 is an illustration of an elastomeric brick having an embedded electrically conducting wire made up of metal fibers according to one or more embodiments.

The use of conductive elastomeric composites to create electrical connections is not limited to sheet or planes. The flexible metal fibers can be incorporated into complex structures, such as molded 3D elastomeric structures, to provide conductivity in flexible and stretchable devices. For example, metal fibers can be embedded in elastomeric bricks. Elastomeric bricks are universal construction elements fabricated from elastomeric polymers—that can be clicked together to assemble many different elastomeric structures. For example, rectilinear elastomeric bricks include pegs and recesses similar to those used by Lego bricks: these features ensure the bricks were properly aligned. This approach is, however, not limited to this design, and many other shapes (e.g., tetrahedrons and other non-orthogonal polyhedra) and types of connections (e.g., ball-socket and other snap connectors) are possible. FIG. 20 is an illustration of a single elastomeric brick 2000, having pegs 2010, 2010' and recesses 2020, 2020'. Metal fibers 2030 are embedded in the brick, spanning peg 2010 and peg 2010'. The major axis of the metal fibers are oriented along the path spanning between the two pegs. Thus, the metal fiber embedded in the elastomeric material provides an stretchable electrically conductive wire between the two peg. The metal fiber wire can conduct electricity, as is illustrated in the device shown in FIG. 21.

The invention is described with reference to the following figures, which are presented for the purpose of illustration only and are not intended to be limiting of the invention.

Example 1. Fabrication and Characterization of a
Conductive Elastomeric Composite Having Metal
Fibers Oriented Parallel to the Elastomer Sheet Fabrication of Conductive Elastomeric Composite Sheets.

Conductive elastomeric sheets, containing <1% metal wool by volume, were fabricated by first soaking a sheet of metal wool (steel wool grade "0000," Steel Wool International; "Fine" aluminum pads item #123170, McMaster-Carr; or "Fine" bronze wool, Global Material Technologies Inc.) in uncured Ecoflex 00-30 (Smooth-On, Inc.) (FIG. 1A). Next, the soaked metal wool sheet is compressed between two metal plates and cured in an oven at 60° C. for >2 hrs (FIG. 1B). After curing, the excess Ecoflex 00-30 at the periphery of the encapsulated metal wool is trimmed to generate the composite sheet (FIG. 1C). It was observed that the electrical and mechanical anisotropy of the conductive elastomeric composite material can be diminished by fabricating a layered composite with the majority fiber axis of each metal wool sheet oriented in different directions.

Characterization of Anisotropy in Fiber Orientation.

The anisotropy in fiber orientation of the conductive elastomeric composite was characterized by collecting micro X-ray computed tomographic data on a conductive elastomeric composite sheet. VGStudio software was used to measure the fiber orientation distribution in the steel wool. The steel wool in the composite had a distribution of fiber orientations centered on the long axis of the unfurled roll (which is referred to as the majority fiber axis), with an angle deviation of HWHM=42°. Mechanical testing of the conductive elastomeric composite sheets indicated they were relatively rigid along the majority fiber axis, but extensible along the axis perpendicular to the majority fiber axis (FIG. 2B).

The anisotropy in the orientation of the steel fibers also results in an anisotropy in the conductivity of the conductive elastomeric composite. The flow of electrical current through a conductive elastomeric composite sheet when current is transmitted parallel and perpendicular to the majority fiber axis was visualized by collecting the thermal profile: the pattern of resistive heating that occurs when a 5 A current is transmitted through the conductive elastomeric composite for 10 seconds (FIG. 3A) indicates that when the electrical leads are placed in line with the majority fiber axis, electrical current flows in a narrow path between the leads. FIG. 3B suggests that when the electrical leads are connected perpendicularly to the axis of the majority of the fibers the current takes a tortuous route through the conductive elastomeric composite sheet. This difference in the flow of electrical current helps to explain the difference in resistance observed at the end of each measurement when transmitting current parallel, 0.6Ω, and perpendicular, 1.5Ω, to the majority fiber axis.

Example 2. Fabrication of a Conductive
Elastomeric Composite Having Metal Fibers
Oriented Perpendicular to the Elastomer Sheet First a mold for constructing the device was 3D printed out of ABS plastic (Stratasys Dimension Elite) (FIG. 6A). Next, sulfur free clay (Sculptex Medium Modeling Clay; Reynolds Advanced Materials) was placed in a recess at the base of the mold and steel wool (grade "0000," Steel Wool International) was placed on top (FIG. 6B). Clay was used both to affix the steel wool prior to the addition of uncured elastomer and to mask the metal fibers at the base of the wool so that they remain uncoated by elastomer thereby minimizing the resistance of the final device. Uncured Ecoflex 00-30 (Smooth-On, Inc.) was then added to the mold (FIG. 6C) followed by curing in an oven at 60° C. for >2 hrs (FIG. 6D). Finally, the cured material was demolded and the excess steel wool was trimmed with a scissor to create the finished device (FIG. 6E).

FIG. 5 shows a sheet made from a silicone elastomer with a conductive elastomeric composite disk at its center; this disk creates an electrical pathway across the sheet with a resistance of 1.0Ω. In order to provide a visual indication of the conductive elastomeric composite's conductivity, a nickel chromium wire was inserted into either side of the conductive elastomeric composite disk and a current of 2.45 A was transmitted through the disk as indicated by the black body radiation being emitted from the wires. Here, the majority fiber axis of the conductive elastomeric composite disk is oriented perpendicularly to the plane of the sheet; this orientation minimizes the resistance across the sheet.

Figure 8A:
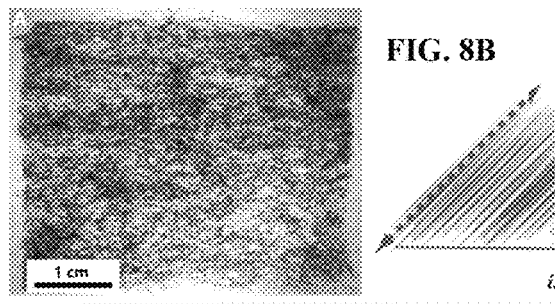
FIGS. 8A-8F is a schematic illustration of the fabrication and embedding of steel wool conductive elastomeric composite disks in elastomeric films according to one or more embodiments.
Figure 8B:
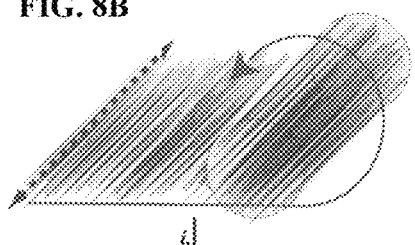
Figure 8C:
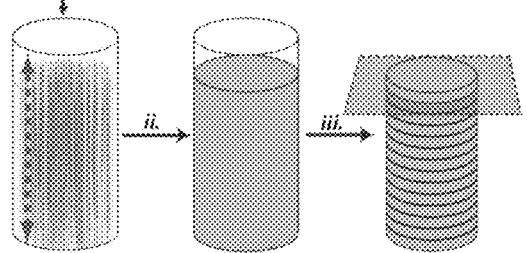
Figure 8D:
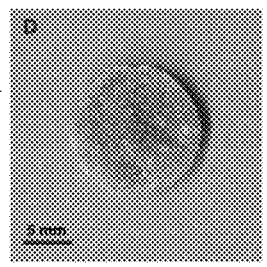
Figure 8E:
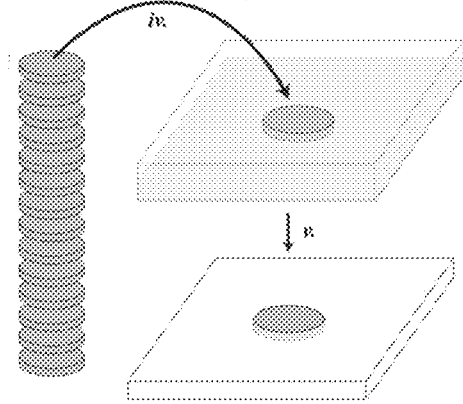
Figure 8F:
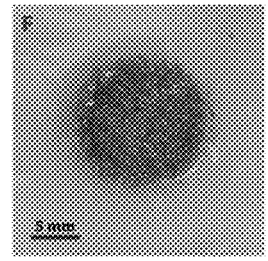

Example 3. Fabrication of an Elastomeric Sheet
with Embedded Conductive Elastomeric Composite
Disks The fabrication is described with reference to FIGS. 8A-8F. First, a length of naked steel wool (grade "0000," Red Devil) was rolled in the direction of its minor fiber axis to create a dense cylinder of steel wool whose fibers are aligned with the axis of the cylinder. FIG. 8A is an optical micrograph of steel wool used in this example. The dotted line shows the axis along which the majority of the fibers are oriented. FIG. 8B is a schematic illustrating how the steel wool is rolled up. This cylinder was then placed in a falcon tube with Ecoflex 00-30, cured at 80° C. for >40 min, and sectioned into disks with a razor blade, as shown in FIG. 8C. The resulting conductive elastomeric composite disks, shown in FIG. 8D, were subsequently embedded in sheets of Ecoflex 00-30. As shown in FIG. 8E, the disc is then placed in a second mold (iv) that is then filled with Ecoflex 00-30 up to the top edge of the disc and cured at 80° C. for >40 min (v), generating an elastomeric sheet with regions of steel wires transecting the height of the sheet. FIG. 8F is a photograph the resulting conductive elastomeric composite disk is embedded in an elastomeric film.

Figure 17:
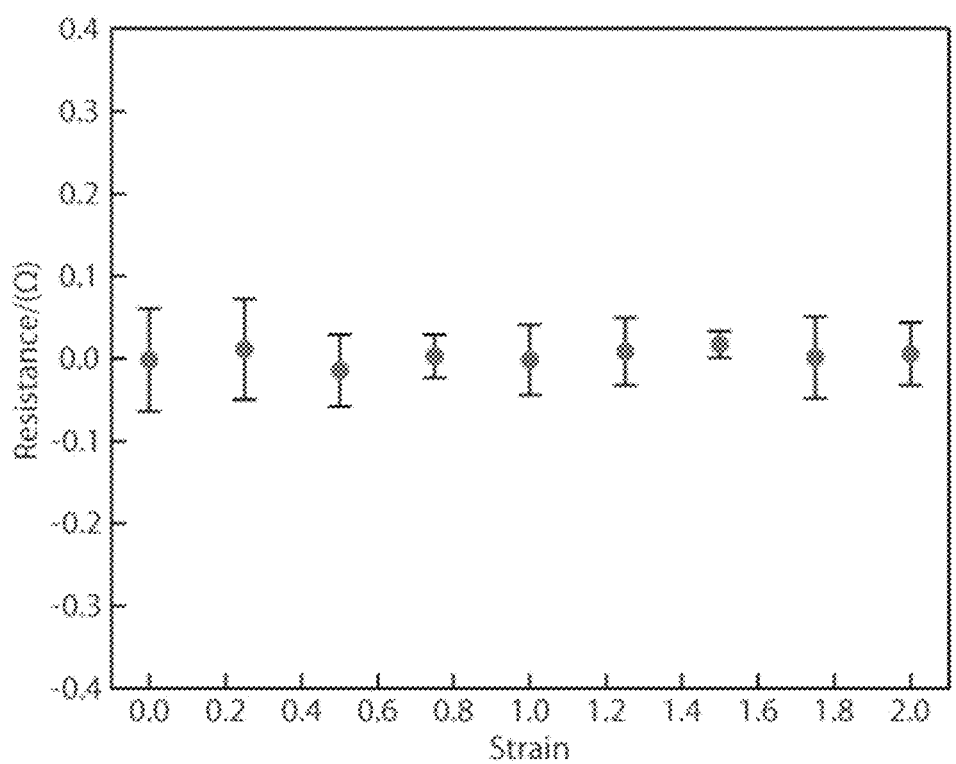
FIG. 17 shows the effect of strain on the resistance of a conductive elastomeric composite via and illustrates a plot of the average resistance of n=7 conductive elastomeric composite disk shaped vias embedded in elastomeric sheets as the system was strained.
Figure 18:
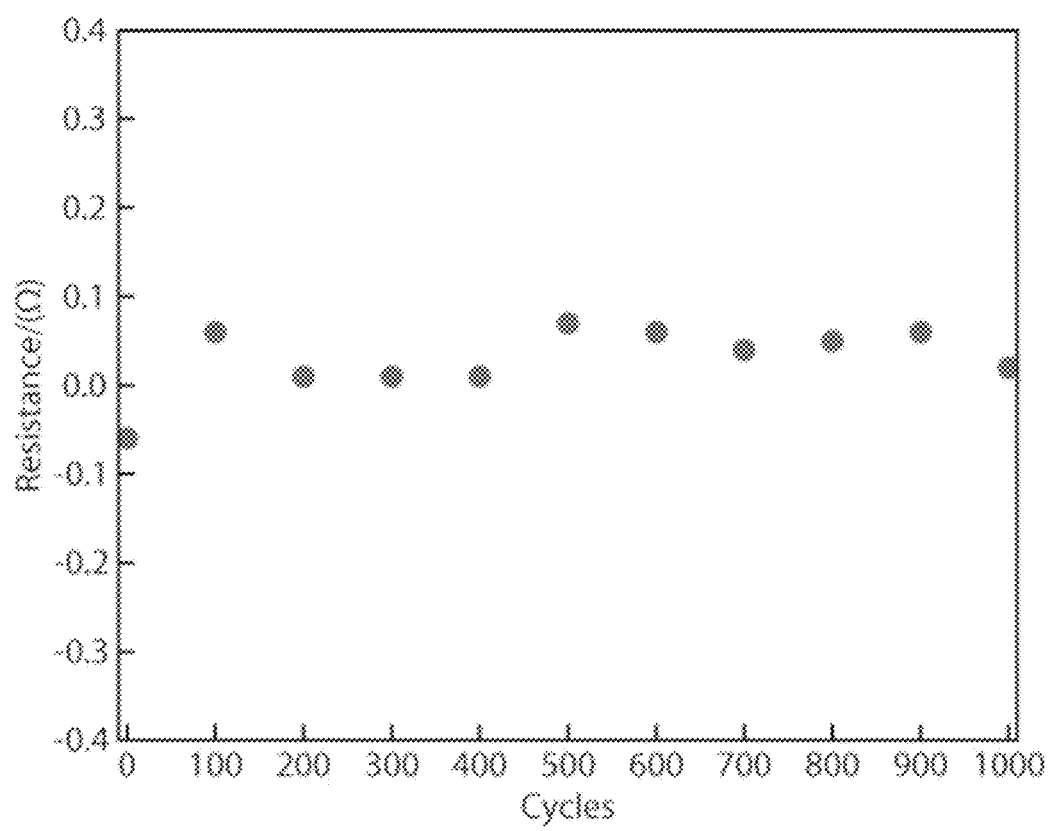
FIG. 18 shows the effect of cyclic fatigue on the resistance of a conductive elastomeric composite via and illustrates a plot of the resistance of a single conductive elastomeric composite disk shaped via embedded in an elastomeric sheet as the system was cycled 1000 times to an elongation of 100%.
Figure 19:
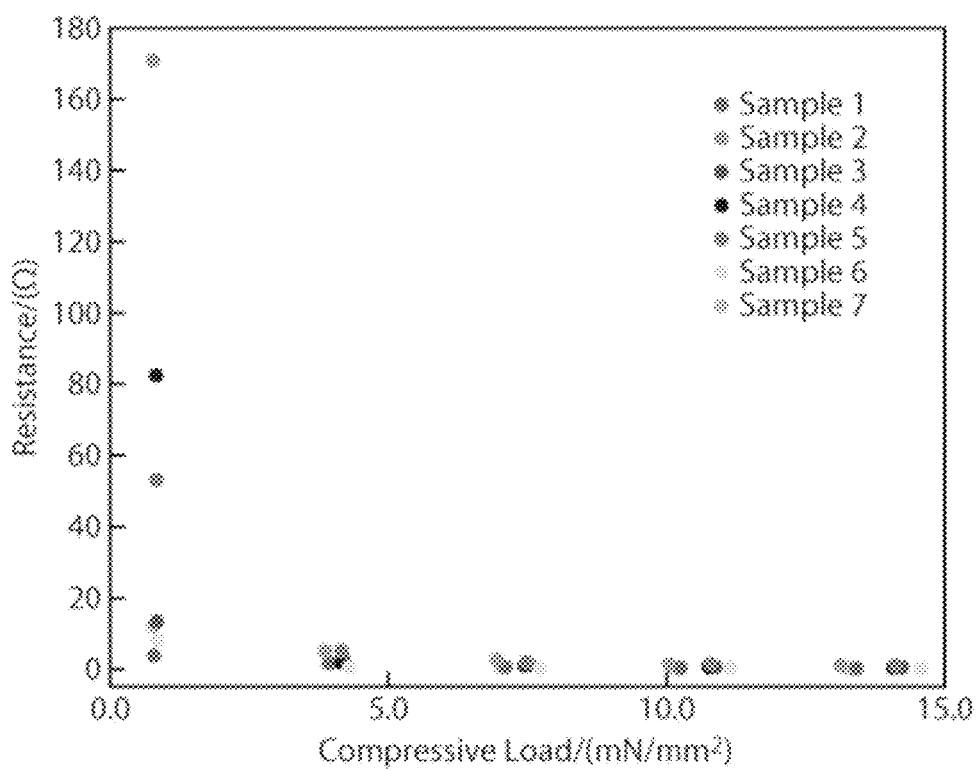
FIG. 19 shows the effect of compression on the resistance of a conductive elastomeric composite via and illustrates the plot of the resistance of n=7 conductive elastomeric composite disk shaped vias embedded in elastomeric sheets as a function of compression, in which samples were compressed parallel to the majority fiber axis of the conductive elastomeric composite disks and perpendicular to the long axis of the elastomeric sheets.

Example 4. Functional Characterization of
Conductive Elastomeric Composite Disks In order to validate the utility of conductive elastomeric composites as electrical vias in extensible soft devices, we characterized the resistance of conductive elastomeric composite disks embedded in elastomeric sheets as a function of extension and compression. For these experiments, 4×34×117 mm elastomeric sheets were fabricated with a conductive elastomeric composite disk at their center with a diameter of 8.8±0.2 mm and a height of 7.6±0 3 mm (based on measurements of the dimensions of n=7 conductive elastomeric composite disks) and whose majority fiber axis was perpendicular to the plane of the sheet. For sheet extension experiments, samples were clamped so that the sheets were extended perpendicular to the majority fiber axis of the conductive elastomeric composite disk and parallel to the long axis of the sheet with a distance of 70 mm between the clamps. The samples were found to be highly extensible with an elongation at break of 429±12% (n=3 measurements) resulting from delamination between the elastomer sheet and the conductive elastomeric composite disk. This resilience to extension exceeds the requirements of most soft devices. FIG. 17 shows that the resistance of a conductive elastomeric composite disk does not change during an extension of the sample to a 200% elongation (n=7 measurements of the change in conductive elastomeric composite resistance during extension). Only a small change in resistance, >0.1Ω, was observed when a single sample was cycled 1000× to an elongation of 100%, as shown in FIG. 18. conductive elastomeric composite resistance experiments as a function of compression were conducted by placing the sheet samples between conductive plates and compressing the samples parallel to the majority fiber axis of the conductive elastomeric composite disk and perpendicular to the long axis of the sheet. FIG. 19 shows that although the resistance amongst the samples varied during initial loading (<13×10$^{-3}$ N mm$^{-2}$), this variation reduced at higher loading. A conductive elastomeric composite resistance of <1.0Ω was achieved for all samples at a compressive loading of >13×10$^{-3}$N mm$^{-2}$ (n=7 measurements of the change in resistance during compression).

Example 5. Fabrication of a Soft Solderless Breadboard

The fabrication is described with reference to FIGS. 10A-10F. FIG. 10A is a perspective view and FIG. 10B is a cross-sectional view of mold 1010, illustrating the main housing 1020 for formation of the elastomeric base of the breadboard and channels 1030 for formation of conductive elastomeric receptacles of the breadboard. The mold 1010 for constructing the device was 3D printed out of ABS plastic (Stratasys Dimension Elite). Next, steel wool 1035 (grade "0000," Steel Wool International) was inserted into all of the recessions of the mold to create electrical receptacles 1045 for hard electrical components, as well as being placed between selected recessions to create the electrical connections 1040 between receptacles. FIG. 10C shows the placement of the steel wool to create the conductive paths and receptacles. Uncured Ecoflex 00-30 1050 (Smooth-On, Inc.) was then added to the mold, followed by curing in an oven at 60° C. for >2 hrs, as shown in FIGS. 10D and 10E, respectively. Finally, after curing, the device was demolded to create the finished soft solderless breadboard 1060. FIG. 10F is a cross-section of the finished soft solderless breadboard including conductive elastomeric receptacles 1045, electrical interconnections 1040 and elastomeric base 1020.

Example 6. Fabrication of a Soft Pressurized Switch

Figure 13A:
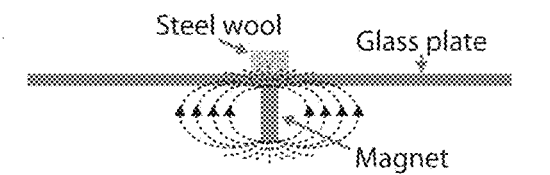
FIGS. 13A-13G illustrate the fabrication of a soft pressurized switch, according to one of more embodiments.
Figure 13B:
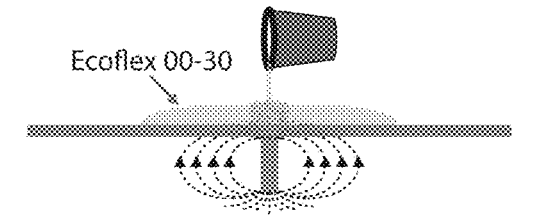
Figure 13C:
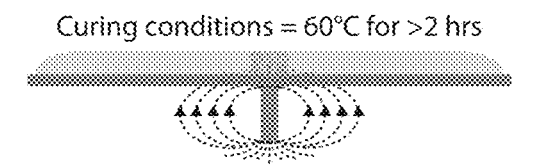
Figure 13D:
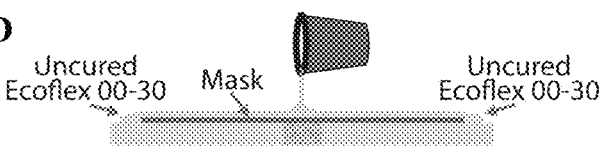
Figure 13E:
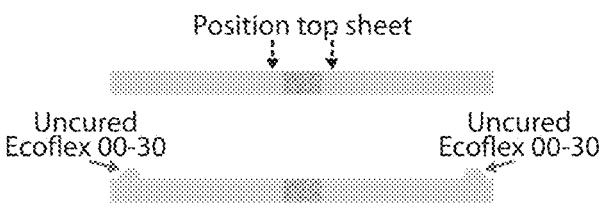
Figure 13F:
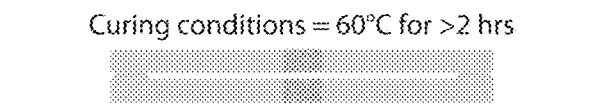
Figure 13G:

The fabrication is described with reference to FIGS. 13A-13G. First, a rectangular prism shaped nickel plated neodymium magnet (K&J Magnetics) was placed underneath a glass plate and a pad of ferromagnetic steel wool (grade "0000," Steel Wool International) was placed on top of the glass plate (FIG. 13A). Placing a magnet underneath the glass plate served to both affix the steel wool pad to the plate prior to the addition of elastomer and subsequent curing and to pattern the steel wool pad into a rectangular shape. Uncured Ecoflex 00-30 (Smooth-On, Inc.) was then poured on to the glass plate (FIG. 13B) followed by curing in an oven at 60° C. for >2 hrs (FIG. 13C). After curing, excess elastomer was trimmed from the edges of the sheet to form a square sheet of cured elastomer with a square steel wool pad at its center. Next, a smaller square plastic sheet was placed on top of the cured sheet to act as a mask before uncured Ecoflex 00-30 was poured on top (FIG. 13D). The mask was then removed leaving behind a bead of uncured elastomer at the edges of the cured elastomer sheet. Next, a second square sheet of cured elastomer with a steel wool pad at its center was placed on top (FIG. 13E) and the layered construct was cured in an oven at 60° C. for >2 hrs (FIG. 13F) creating an air tight seal between the sheets. Finally, a steel cannula (Hamilton Company) was used to puncture a hole into the layered construct so that an air supply line (Tygon tubing, ID=1/32", OD=3/32", Wall=1/32", Saint-Gobain Performance Plastic) could be inserted into the gap between the cured elastomer sheets, producing the finished soft pressurized switch.

Example 7. Fabrication of a Soft Strain Gauge

Figure 15A:
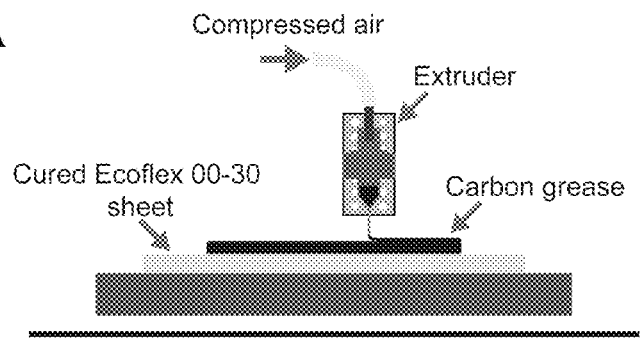
FIGS. 15A-15D illustrates the fabrication of electrical feedthroughs for embedded carbon grease channels in a soft strain gauge according to one or more embodiments.
Figure 15B:
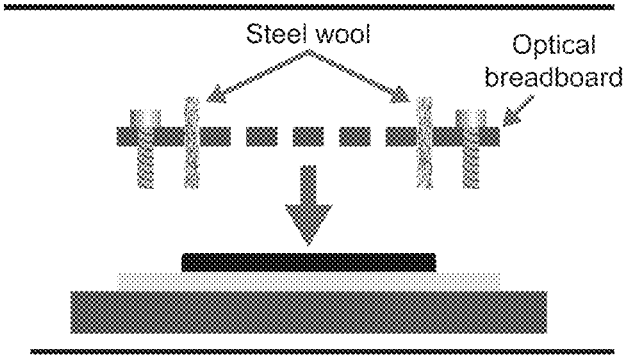
Figure 15C:
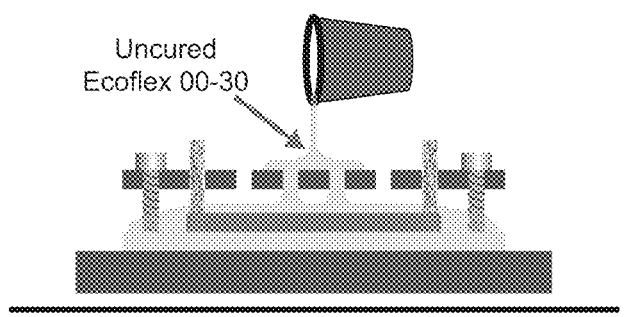
Figure 15D:
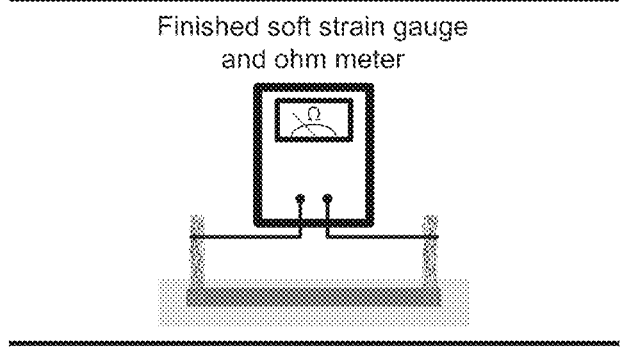

The fabrication is described with reference to FIGS. 15A-15D. Silicone-based conductive carbon grease (MG Chemicals) was printed on a cured sheet of Ecoflex 00-30 (Smooth-On, Inc.) using a pressurized syringe mounted in an Aerotech ABG 1000 gantry system (FIG. 15A). The carbon grease was extruded out of a 0.84 mm diameter orifice at a driving pressure of 69-103 kPa using a print speed of 0.75-1.25 mm/s leaving a carbon filament of ~650 μm in diameter. Using the 3D printing capability of the Aerotech ABG1000 gantry system, the carbon grease was printed in stacks of six filaments, producing a free standing line of grease. ~3.9 mm in height. Next, an optical breadboard was used to hold steel wool (grade "0000," Steel Wool international) fiber bundles in contact with the grease (FIG. 15B). Next, more uncured Ecoflex 00-30 was poured on top of the grease and cured in an oven at 80° C. for >40 min (FIG. 15C) Finally, the sensor is cut free from the mold leaving a block of Ecoflex 00-30 with steel wool at either end that is in conductive contact with the central channel of carbon grease (FIG. 15D).

Example 8. Heterogeneous Materials for Multi-Functional Structures

A strategy based on soft robotics prepared from the assembly of tiles can be extended to other properties (e.g., electrical conductivity, optical transparency, or magnetic responsiveness). Using this extension, it is possible to create multi-functional structures with characteristics that depend on the properties of the elastomeric tiles used in their assembly. To demonstrate this concept, we fabricated tiles with conductive regions and assembled inflatable cubes from them (FIG. 16). The conductive "patches" of the tiles were composed of silicone elastomer containing embedded metallic wool that supported conductivity, but that did not significantly alter the mechanical properties of the elastomer itself (as evidenced by the observed isotropic inflation). A light-emitting diode (LED) was connected to the conductive patches inside of the cube as a means to visualize the formation of a conductive pathway through the elastomeric tiles and across the cubes themselves. When this structure is placed between two metallic plates and inflated, the conductive patches on opposing faces of the cube made electrical contact with the plates, which were held at a 3 V bias, and a completed circuit was formed. If the orientation of the structure relative to the polarity of the plate electrodes was correct, the LED was biased in the forward direction allowing current to flow through the circuit. This current powered up the LED illuminating the inflated structure (FIG. 16A-D).

Figure 16F:
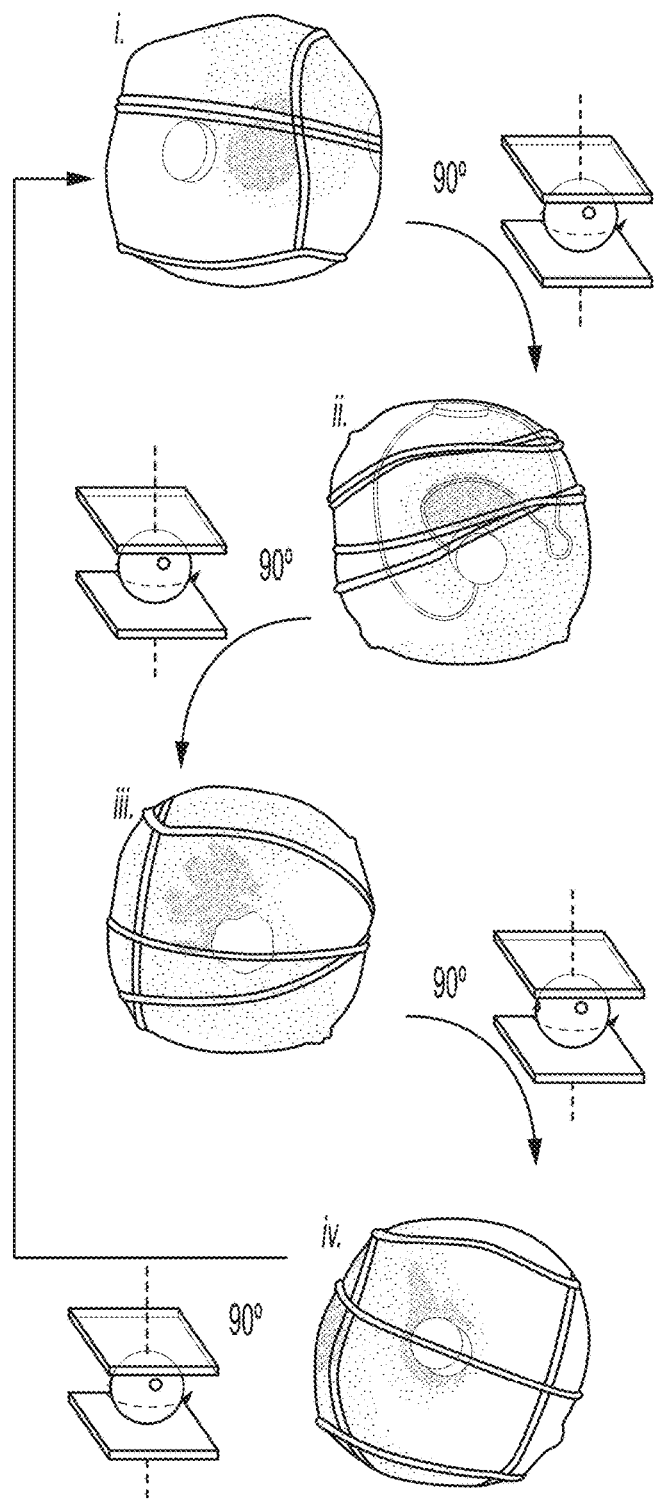

Rotating the structure about an axis parallel to the surface of the plate electrodes broke electrical contact with the conductive patches and the LED switched off; likewise, flipping the orientation of a structure in an illuminated state upside down, led to a negative bias across the LED and no light is emitted (FIG. 16E). Rotating the inflated structure, as connected in FIG. 16C, along the axis passing through the pair of conductive patches in contact with the electrodes maintained the positive bias across the LED and the structure remained illuminated (FIG. 16F). The dependence of the on/off state of the LED on the direction of bias provides a method to encode (based upon the configuration of the electrical contacts inside the structure) information about the orientation of a structure that was geometrically symmetric.

Example 9. Electrically Wired Elastic Brick Soft Device

Figure 21A:
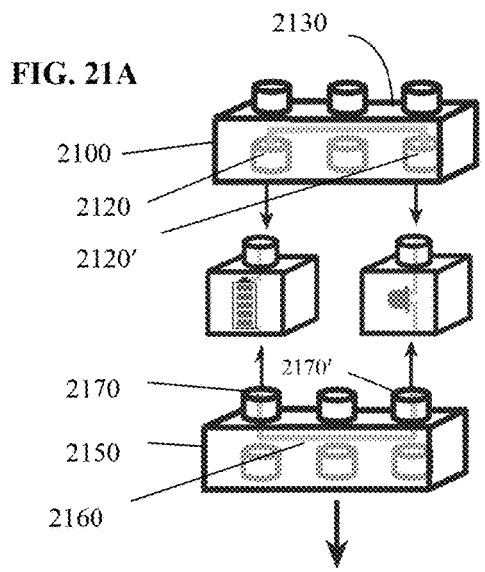
FIGS. 21A-21F are illustrations of a soft device according to one or more embodiments including (A-B) of elastomeric bricks having electrical or electronic components embedded therein, (C-D) of an assembled device and (E-F) of the device in a rearranged orientation, according to one or more embodiments.
Figure 21B:
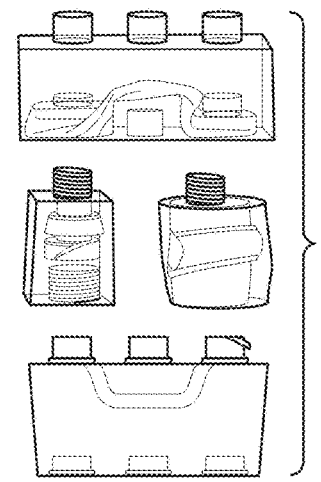
Figure 21C:
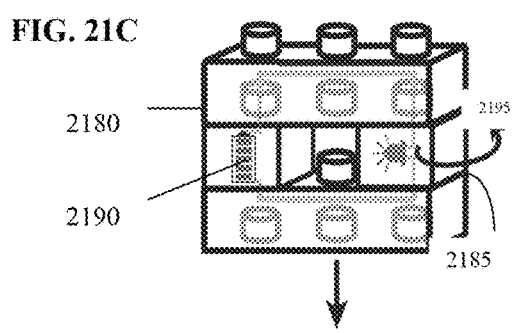
Figure 21D:
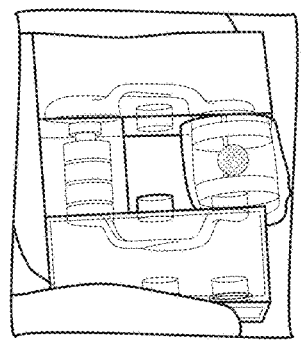
Figure 21E:
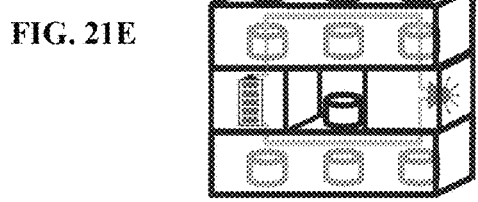
Figure 21F:
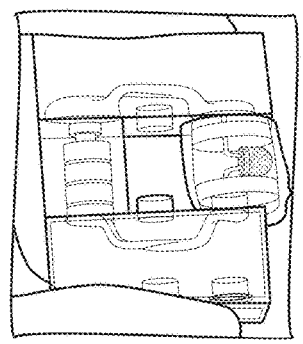

A number of elastomeric bricks were provided as illustrated in FIGS. 21A and 21B. The elastomeric bricks with conductive elastomeric composite pegs were made the same way as the soft solderless bread board, by inserting the steel wool in the receptacles of a 3D printed mold. The elastomeric bricks with conductive elastomeric composite receptacles were made in a similar way but now steel wool was wound around the pegs of a 3D printed mold. The upper brick 2100 included a metal fiber 'wire' 2130 that forms an electrical conduit between recesses 2120 and 2120' and also electrical connectivity to external electrical features. Similarly, lower brick 2150 included a metal fiber 'wire' 2160 that forms an electrical conduit between pegs 2170 and 2170' and also electrical connectivity to external electrical features. Central elastomeric bricks 2180 and 2185 have embedded battery 2190 and LED 2195, respectively, which are suitably wired to provide electrical connectivity to external electrical features. FIGS. 21C and 21D show the assembled device. The pieces can be pressed together, thereby creating the electrical circuit that powers the light. In this demonstration the elastomer bricks are not glued together so that the electronic circuits could be reconfigured. See, e.g., FIG. 21E, where the LED brick is rotated without disconnecting the circuit.

We have shown that conductive elastomeric composites can be used to create electrical connections to hard metal components and liquids while they move and change shape, capabilities that are not achievable with conventional electronics. We have focused on conductive elastomeric composites made from silicone elastomers and steel wool, but other combinations of elastomers and metal wools are equally compatible with our approach. Conductive elastomeric composites solve a common problem in the field of soft devices: viz, how to create an electrical connection through an elastomeric polymer. Conductive elastomeric composites will be useful in soft robotics, where making stretchable electrical connections will facilitate the incorporation of hard electrical and mechanical components (e.g., pneumatic and hydraulic pumps, solenoid valves, nitinol actuators, sensors, etc.) into soft bodies. Since placing fibers in an elastomer makes the elastomer less extensible, the composites disclosed herein can be used as a strain limiting layer of a soft bending actuator. Soft devices can be made with composites of elastomers and conductive nets (i.e., a metal mesh). For example, a McKibben actuator that uses a metal mesh can be used. A fiber reinforced actuator that uses metal fibers instead of Kevlar can also be used in conjunction with the composites disclosed herein so the reinforcement can conduct current.

It will be appreciated that while a particular sequence of steps has been shown and described for purposes of explanation, the sequence may be varied in certain respects, or the steps may be combined, while still obtaining the desired configuration. Additionally, modifications to the disclosed embodiment and the invention as claimed are possible and within the scope of this disclosed invention.

The invention claimed is:

1. A conductive elastomeric composite, comprising:
a plurality of conductive fibers embedded in an elastomeric substrate providing a conductive pathway in the composite;
wherein the conductive fibers have a majority fiber axis and the majority fiber axis defines a first conductive pathway in the composite, wherein at least some of the conductive fibers have a length sufficient to span the first conductive pathway and at least some of the conductive fibers have ends that are exposed to provide electrical contact;
wherein the composite is flexible, stretchable and exhibits anisotropic mechanical and electrical properties; and
wherein the composite exhibits a reduction in resistance as the composite is stretched in a direction perpendicular to the majority fiber axis for current applied in the same direction.

2. The conductive elastomeric composite of claim 1, wherein the conductive fibers comprise a bundled assembly of non-woven or non-braided or non-cabled metal fibers.

3. The conductive elastomeric composite of claim 1, wherein the conductive fibers comprise carbon fibers.

4. The conductive elastomeric composite of claim 1, wherein the conductive fibers comprise conductive polymer fibers.

5. The conductive elastomeric composite of claim 1, wherein the conductive fibers are selected from the group of metal filaments, carbon filaments, woven wire mats, helical wire coils, and wires bundled at the ends and fanned out in between.

6. The conductive elastomeric composite of claim 1, wherein the conductive fibers comprise metal wool.

7. The conductive elastomeric composite of claim 1, wherein a conductive pathway transverse to the first conductive pathway has a lower conductivity than that of the first conductive pathway.

8. The conductive elastomeric composite of claim 1, wherein the conductive fibers have a length in the range of 1 mm to 100 cm.

9. The conductive elastomeric composite of claim 1, wherein the conductive fibers have a diameter in the range of 0.5 μm to 500 μm.

10. The conductive elastomeric composite of claim 1, wherein the elastomeric substrate is a sheet or membrane and the majority fiber axis traverses the thickness of the substrate.

11. The conductive elastomeric composite of claim 10, wherein the composite is in the form of a disk and the disk is configured to provide electrical contact to an electrical component.

12. The conductive elastomeric composite of claim 1, wherein the elastomeric substrate is a sheet or membrane and the majority fiber axis is in the plane of the sheet or membrane.

13. The conductive elastomeric composite of claim 1, wherein the elastomeric substrate is a molded article and the majority fiber axis defines a linear or non-linear conductive pathway between two or more locations of the elastomeric substrate.

14. The conductive elastomeric composite of claim 1, wherein the conductive pathway has a resistivity in the range from about $10^{-8}$ to 10 Ohm·m or about $10^{-6}$ to 1 Ohm·m, or about $10^{-5}$ to $10^{-2}$ Ohm·m at 20° C.

15. The conductive elastomeric composite of claim 1, wherein the conductive pathway is electrically connected to an external power source.

16. The conductive elastomeric composite of claim 1, wherein the conductive pathway is electrically connected to an electrical component selected from lights sensors, indicators, actuators, nitinol actuators, electroactive polymer actuators, switches, capacitors, resistors, transistors, displays, force sensors, touch sensors, flow sensors, pressure sensors, range finders, shear sensors, temperature sensors, cameras, light emitting diodes, zener diodes, batteries, electro pneumatic transducers, haptic touch screens, microcontrollers, operational amplifiers, strain gauges, pneumatic, vacuum or hydraulic pumps, solenoid valves, speakers, microphones, or heating elements.

17. A soft robot comprising the conductive elastomeric composite of claim 1 to provide an electrical connection.

18. A strain gauge comprising the conductive elastomeric composite of claim 1.

19. A switch comprising the conductive elastomeric composite of claim 1.

* * * * *